US012809264B2

(12) United States Patent
Brennan

(10) Patent No.: US 12,809,264 B2
(45) Date of Patent: Nov. 24, 2026

(54) METHOD AND SYSTEM OF PHOTOLITHOGRAPHY TO FORM CONFORMAL CIRCUITS ON CURVED SURFACES

(71) Applicant: General Dynamics Mission Systems, Inc., Fairfax, VA (US)

(72) Inventor: Thomas E. Brennan, Chilhowie, VA (US)

(73) Assignee: GENERAL DYNAMICS MISSION SYSTEMS, INC., Fairfax, VA (US)

( * ) Notice: Subject to any disclaimer, the term of this patent is extended or adjusted under 35 U.S.C. 154(b) by 118 days.

(21) Appl. No.: 18/900,101

(22) Filed: Sep. 27, 2024

(65) Prior Publication Data

US 2026/0093181 A1 Apr. 2, 2026

(51) Int. Cl.

*G03F 7/24* (2006.01)
*G03F 7/22* (2006.01)
*H05K 3/12* (2006.01)

(52) U.S. Cl.

CPC .................. *G03F 7/24* (2013.01); *G03F 7/22* (2013.01); *H05K 3/1275* (2013.01)

(58) Field of Classification Search

CPC ............ G03F 7/24; G03F 7/22; H05K 3/1275
See application file for complete search history.

(56) References Cited

U.S. PATENT DOCUMENTS

| | | | | |
|---|---|---|---|---|
| 5,691,541 | A * | 11/1997 | Ceglio | G03F 7/70791 378/34 |
| 6,238,852 | B1 * | 5/2001 | Klosner | G03F 7/704 355/53 |
| 6,416,908 | B1 | 7/2002 | Klosner et al. | |
| 9,079,349 | B2 | 7/2015 | Slafer | |
| 11,218,677 | B2 * | 1/2022 | Tsubota | G06F 3/04166 |
| 11,424,144 | B2 | 8/2022 | Huang et al. | |
| 11,847,570 | B2 * | 12/2023 | Koopman | G06F 18/24133 |
| 12,044,980 | B2 * | 7/2024 | Slachter | G03F 7/70616 |
| 2017/0094801 | A1 | 3/2017 | Choi et al. | |

FOREIGN PATENT DOCUMENTS

JP 5106099 B2 12/2012

* cited by examiner

*Primary Examiner* — Hung V Nguyen
(74) *Attorney, Agent, or Firm* — Ingrassia Fisher & Lorenz, LLP

(57) ABSTRACT

A method includes receiving data of an image of a circuit pattern having multiple circuit pattern slices, and providing the data to a light projector aimed toward at least one light-sensitive material over a substrate of an object. The method also includes generating a patterned light-sensitive material, including projecting at least one temporal sequence of frames from the light projector. Each frame within a single temporal sequence has an image of a different one of the circuit pattern slices and projected so that each circuit pattern slice forms a contour line on the light-sensitive material. The method includes moving the light projector, the substrate, or both after an individual frame projection so that each contour line in the same temporal sequence is formed at a different location on the at least one light-sensitive material. The patterned light-sensitive material is used to pattern a conductive material over the substrate.

18 Claims, 12 Drawing Sheets

METHOD AND SYSTEM OF PHOTOLITHOGRAPHY TO FORM CONFORMAL CIRCUITS ON CURVED SURFACES

TECHNICAL FIELD

The subject matter described herein relates generally to printing circuits on substrates, and more particularly, photolithography to print conformal circuits on curved substrates.

BACKGROUND

Many object designs can benefit from the use of curved circuit boards. Curved circuit boards can save internal space in an aircraft or automobile chassis, for example, where a stack or array of flat printed circuit boards (PCBs) do not conveniently fit. In an aircraft nosecone or on curved panels on a fuselage or wings of an aircraft, metallic traces conforming to inner or outer curved surfaces can be used to replace wiring harnesses and/or function as integrated antenna elements or frequency selective surfaces. Also, curved PCBs centered about an axis of symmetry of a vehicle can make a moment of inertia more predictable and improve stability and attitude control. In compact vehicles such as autonomous drones, reducing weight, using internal volume efficiently, and balancing inertial loads with curved PCBs can become even more important. Conformal circuits on curved surfaces, however, are difficult to produce because the photolithography techniques being used must compensate for light being out of focus due to varying distances between a light projector and the curved surface of a substrate. Hence, it is desirable to manufacture high quality curved printed circuit boards that do not unreasonably increase the expense and manufacturing complexity of the curved circuit board.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one example implementation, a method includes receiving data of an image of a circuit pattern having multiple circuit pattern slices, and providing the data to a light projector aimed toward at least one light-sensitive material over a substrate. The method includes generating a patterned light-sensitive material, including projecting at least one temporal sequence of frames from the light projector. Each frame within a single temporal sequence has an image of a different one of the circuit pattern slices and projected so that each circuit pattern slice forms a focused contour line on the at least one light-sensitive material. The method includes moving the light projector, the substrate, or both after an individual frame projection so that each contour line in the same temporal sequence is formed at a different location on the at least one light-sensitive material. The method includes generating a conductive circuit on the substrate comprising using the patterned light-sensitive material to pattern at least one conductive material over the substrate.

In another example implementation, a system includes a light projector to project frames each having data of a different circuit pattern slice of a circuit pattern image and to project a focal plane having a contour line formed from one of the circuit pattern slices. The system also includes a substrate mount to hold a substrate of an object at a position to intersect the focal plane, memory, and processor circuitry forming at least one processor communicatively coupled to the memory and the light projector. The processor is arranged to operate by generating a patterned light-sensitive material including projecting at least one temporal sequence of the frames from the light projector and toward at least one light-sensitive material over the substrate so that each frame forms one of the contour lines on the at least one light-sensitive material. The processor also moves at least one of the light projector, the substrate, or both after an individual frame projection so that each contour line in the same temporal sequence is formed at a different location on the light-sensitive material. The processor also is arranged to operate by generating a conductive circuit over the substrate comprising using the patterned light-sensitive material to pattern at least one conductive material over the substrate.

In yet another example implementation, at least one non-transitory computer-readable medium has computer-executable instructions stored thereon that, when executed by a computing device, cause the computing device to operate by receiving data of a circuit pattern image having multiple circuit pattern slice images and arranged to be used to project the circuit pattern slice images at a light projector aimed toward at least one light-sensitive material over a substrate of an object. The instructions also cause the computing device to operate by generating a patterned light-sensitive material comprising projecting at least one temporal sequence of frame projections. Each frame within a single temporal sequence has a different one of the circuit pattern slice images and projected so that each circuit pattern slice image forms a contour line on the at least one light-sensitive material. The computing device also moves the substrate, the light projector, or both after an individual frame projection so that each contour line in the same temporal sequence is formed at a different location on the at least one light-sensitive material. The instructions also cause the computing device to operate by generating a conductive circuit on the substrate comprising using the patterned light-sensitive material to pattern at least one conductive material over the substrate.

Furthermore, other desirable features and characteristics of the system and method for contour photolithography as described herein will become apparent from the subsequent detailed description and the appended claims, taken in conjunction with the accompanying drawings and the preceding background.

BRIEF DESCRIPTION OF THE DRAWINGS

Implementations of the subject matter will hereinafter be described in conjunction with the following drawing figures, wherein like numerals denote like elements, and.

DETAILED DESCRIPTION

Figure 1:
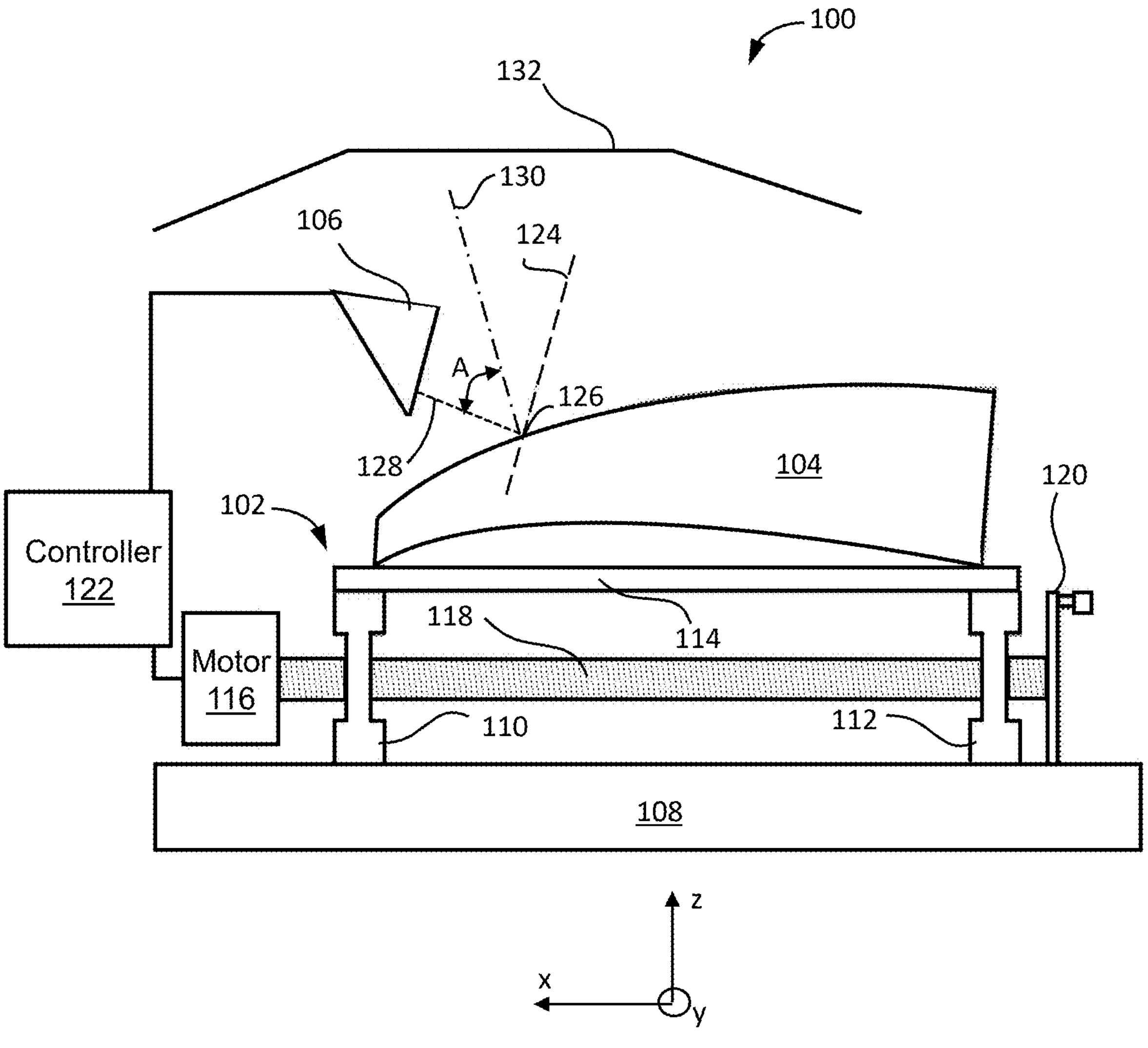
FIG. 1 is a schematic diagram of an example contour photolithography exposure system according to at least one of the implementations herein.

The following detailed description includes example implementations that are not intended to limit the subject matter of the application and uses thereof. Furthermore, there is no intention to be bound by any theory presented in the preceding background, brief summary, or the following detailed description.

Flat printed circuit boards (PCBs) produced by photolithography have physical and material properties that make them ideal components for many objects. Flat PCBs often are made of lightweight, strong, non-conducting composite substrates covered with solderable, high conductivity metal circuit traces that are rugged and well-bonded to the surface. The resulting product can be so durable as to even withstand the extreme physical shock and vibration during the launch of artillery shells, for example. Also, PCBs are compact, and their use saves space inside a chassis or vehicle and eliminates loose wiring that can contribute to unwanted vibration or load-shift.

In order to print conformal circuits on curved substrates, 3D printing techniques have been used that use a curable resin with metallic powder or nano-filaments suspended within the resin. This resin/powder suspension is deposited onto the surfaces by a printhead to form the circuit pattern and then cured and hardened. Several different printing deposition methods such as ink jet, aerosol jet, or direct-write can be used. These techniques, however, all result in metallic traces that are not solderable due to the resin content of the metal ink. These techniques also can have a low electrical conductivity, typically a small fraction of that of the bulk metal, and although can make durable circuits, the resulting circuits are not as durable as the metal traces produced by flat photolithography. Another limitation of using 3D printing to deposit metal traces onto curved surfaces stems from the limited physical tolerances required to successfully deposit the ink. The printhead must be precisely positioned just above, but not touching, the surface, maintaining a trajectory that is locally tangent to that surface while moving from point to point depositing the ink trace. If the printhead is too near or too far from the surface, the quality of the resulting deposited trace can be poor causing electrical discontinuities. Deviations from the expected location of the surface can also cause trace offsets or overspray. In practice, the geometric tolerances encountered with mass produced composite parts can be too large for successful 3D printing without taking additional expensive steps. To minimize print errors, the surface geometry for each part should be measured on a case-by-case basis and scanned into a unique CAD model beforehand, thereby adding significant inefficiencies. An additional complexity is that the quality of the surface finish of the substrate must be controlled for successful ink adhesion. In addition, subsequent assembly steps, such as curing in an autoclave under vacuum or working the substate into a larger assembly, can be too violent for delicate ink and can damage the traces.

In other methods attempted to provide curved circuit printing, lasers can be used to add conformal metal patterns to curved surfaces. The laser scans over a surface thereby activating areas to define the circuit pattern. This activated chemical on the surface subsequently acts as a seed for electroless plating in a metal ion bath, attracting ions to accumulate and form the trace pattern. This laser technique, however, uses a plastic resin that is not compatible with all types of composites. Also, laser methods do not typically achieve the range of scale and resolution possible with photolithography. Finally, the position and angle of the laser must be precisely maintained normal to the surface and scanned over the part with little margin for error. Other laser-direct-write methods can be used for photolithography on curved substrates to expose a light sensitive photoresist for subsequent etching.

In a similar vein, it is also possible to use 3D printing to deposit a resin containing a chemical activation seed for a subsequent step in a plating bath. 3D printing of non-metallic resins is easier and more forgiving of tolerances than metal-containing resins. But again, this technique leads to the same geometric problem of moving above, yet not touching, a complex curved surface. Furthermore, the resolution achieved would have a limit dictated by the print head nozzle and spray pattern. The thinness of the traces is limited by 'fuzziness' of the ink spray. For the resulting traces to have sharp edges after plating, the printed resin path must be at least as sharp as the desired edges.

It is possible to produce curved circuit boards using a masked photolithography process. A mask which has been molded to the shape of the substrate and cut with the desired pattern is put in place over the curved surface as with a painting stencil. The masked part is exposed with a fluorescent lamp for a sufficient time, leaving the desired trace pattern, and then the substrate is developed and etched. A key drawback of this method is that feature resolution is limited by the tools used to cut the pattern into the mask. Furthermore, too many cuts into a mask can make the mask fragile or flimsy. A combination of different masks made at different scales can be used to improve range of scale and resolution, but this is still limited compared to maskless photolithography. Using 3D printing to create the mask, instead of molding and cutting, is possible, but one would again face the aforementioned geometric tolerance challenges.

When a curved substrate has a doubly-curved surface that receives a circuit with a conformal pattern, many of the techniques mentioned above cannot be used or are made much more complex. Specifically, conformal patterning uses a material deposited on a substrate or lower layer that conforms to the shape of the substrate or lower layer. Singly-curved surfaces are those on cones or cylinders usually with a single axis of rotation and a single degree of curvature. The singly-curved circuits are referred to as being developable since singly-curved circuits are often formed by wrapping or bending a flat material onto a singly-curved shape without causing wrinkles. Thus, despite the issues regarding 3D printing above, circuit printing whether rolled photolithography or direct 3D printing can be performed on a singly-curved surface depending on the complexity of the shape of the singly-curved surface.

Doubly-curved surfaces are those that have two degrees of curvature such as a sphere, but other familiar objects such as nosecones are usually doubly-curved as well. However, doubly-curved surfaces can have a changing local curvature and take on more complex shapes than spheres that have a constant double-curvature. This includes doubly-curved shapes ranging from hyperbolic saddles to arbitrary hill and valley topography. Since doubly-curved surfaces are not developable, the available manufacturing processes are often limited to low quality or expensive printing and direct application onto the doubly-curved surface.

To resolve these issues and create single or doubly curved circuits that have the same or similar ruggedness, solderability, conductivity, and feature resolution characteristics of flat PCBs, a maskless contour photolithography method and system is described herein to form conformal, conductive metal circuit patterns on curved substrate surfaces. A digital light processing (DLP) light projector described herein creates a high resolution image within a narrow depth of field that can be taken advantage of by tilting the projector so that a focal plane intersects the curved surface of the substrate. By tilting the focal plane of a light projector relative to a substrate surface, a narrow, high resolution contour line in sharp focus is defined by the intersection of the focal plane and the curved surface of the substrate. This contour line is a slice or part of a projected circuit pattern and is formed by projecting a circuit pattern slice image of a full circuit pattern image. With this arrangement, a circuit pattern is projected in a sequence of frames where each frame has a different circuit pattern slice. By one form, the focal plane can be scanned along the substrate by moving the light projector or substrate or both along an axis so that the distance between the light projector and substrate becomes smaller or larger. The successive contour lines or slices on the substrate can then be exposed by projecting the contour lines in a DLP process and in sequence one slice at a time to create a conformal circuit pattern on the curved surface of the substrate. If the substrate has been plated with metal and coated with a light-sensitive photoresist material, a remaining metallic pattern will be revealed by subsequent development and etching steps.

For clarity and consistency herein, the substrate that is a base for a circuit that is being deposited or mounted on the substrate also may be referred to herein as a part or article of an object, and includes any substrate core or base layer and any intermediate layers between a base layer and the deposited or plated circuit, any of which may be in direct contact with the deposited or plated circuit described herein, unless mentioned otherwise. For consistency, the term object will refer to the more general category of which the substrate is a part, such as a nosecone of an aircraft.

Also for clarity and consistency, a light-sensitive material, including a photoresist, is formed of circuit slices of a circuit pattern. The term projection as a noun or adjective refers to an image on a frame at the light projector, and here where each frame has an image of a slice of the circuit pattern. Thus, a frame being projected at the light projector has a projection circuit pattern slice (or image thereof) at the light projector. In contrast, light already projected onto a surface of the substrate, and is a result of light projection from the light projector, will be referred to as the projected image, projected counter line, projected circuit pattern, or projected circuit pattern slice. Thus, the physical result of a projected contour line and simultaneous exposure of photoresist material due to the projected contour line and subsequent development and treatment is referred to herein as the circuit slice (even though in reality, an entire circuit pattern is to be developed at the same time, and then the entire underlying circuit is to be etched at the same time, rather than in slices).

By using a maskless contour photolithography using DLP, the disclosed method and system can generate a wide range of features projected from centimeter to micrometer scale in a single exposure frame. In addition to achieving a high resolution, the DLP light projector herein sidesteps the need for the complex motions and tight tolerances that make 3D printing on curved surfaces inefficient and challenging. The disclosed method and system also is intrinsically more forgiving of geometric and surface finish variability than 3D printing or laser methods. As long as a substrate surface is in focus and within the depth of field, and no shadows are cast by local topography, a trace pattern can be successfully exposed in the slices described herein. Furthermore, the contour line can be swept over the substate in an efficient and fast movement, while efficiently forming circuits with a wide range of circuit sizes and circuit details.

Figure 14:
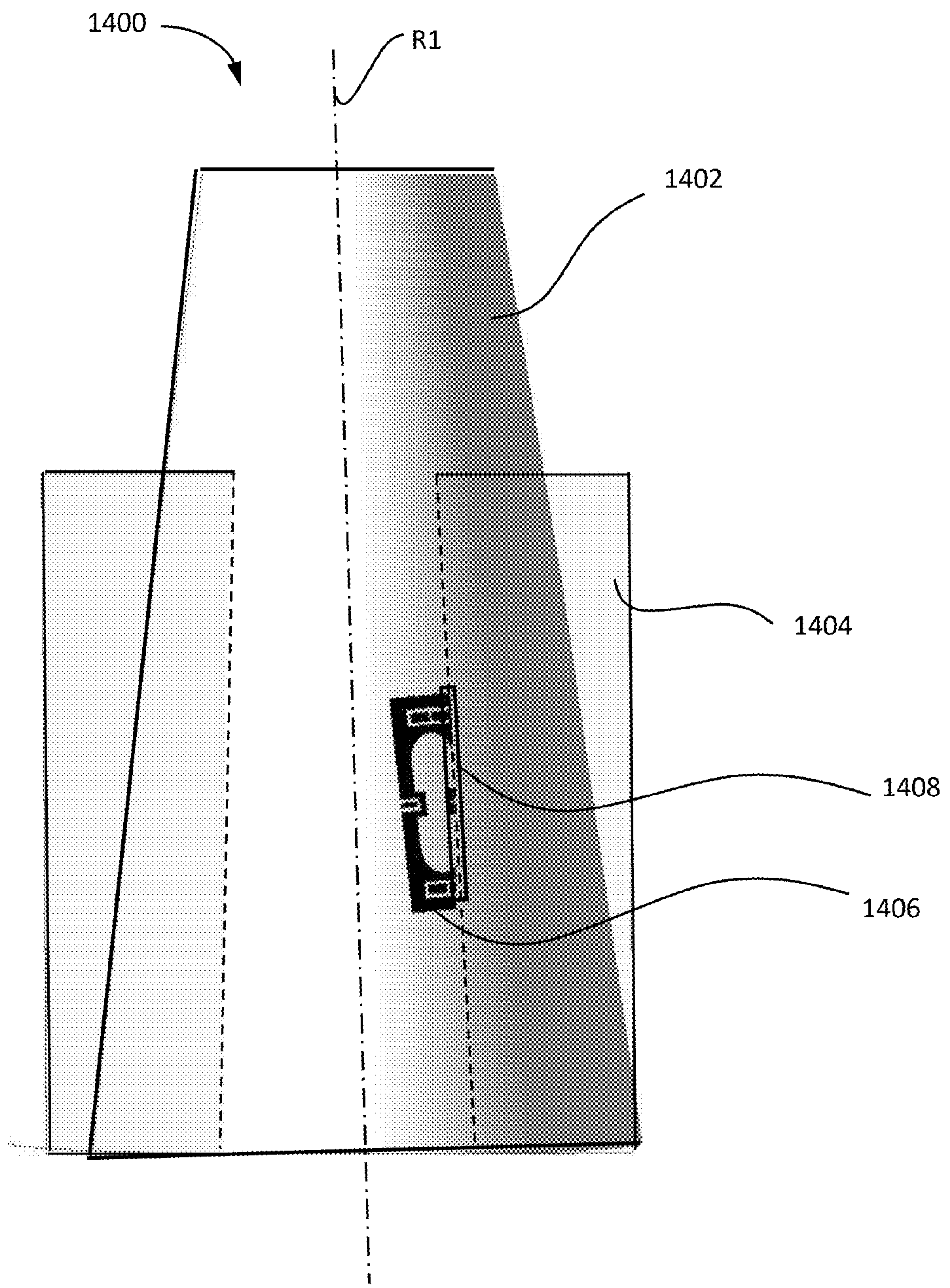
FIG. 14 is a schematic diagram of a side view of a partially generated curved circuit pattern on a substrate using a lathe type of process according to at least one of the implementations herein.
Figure 15:
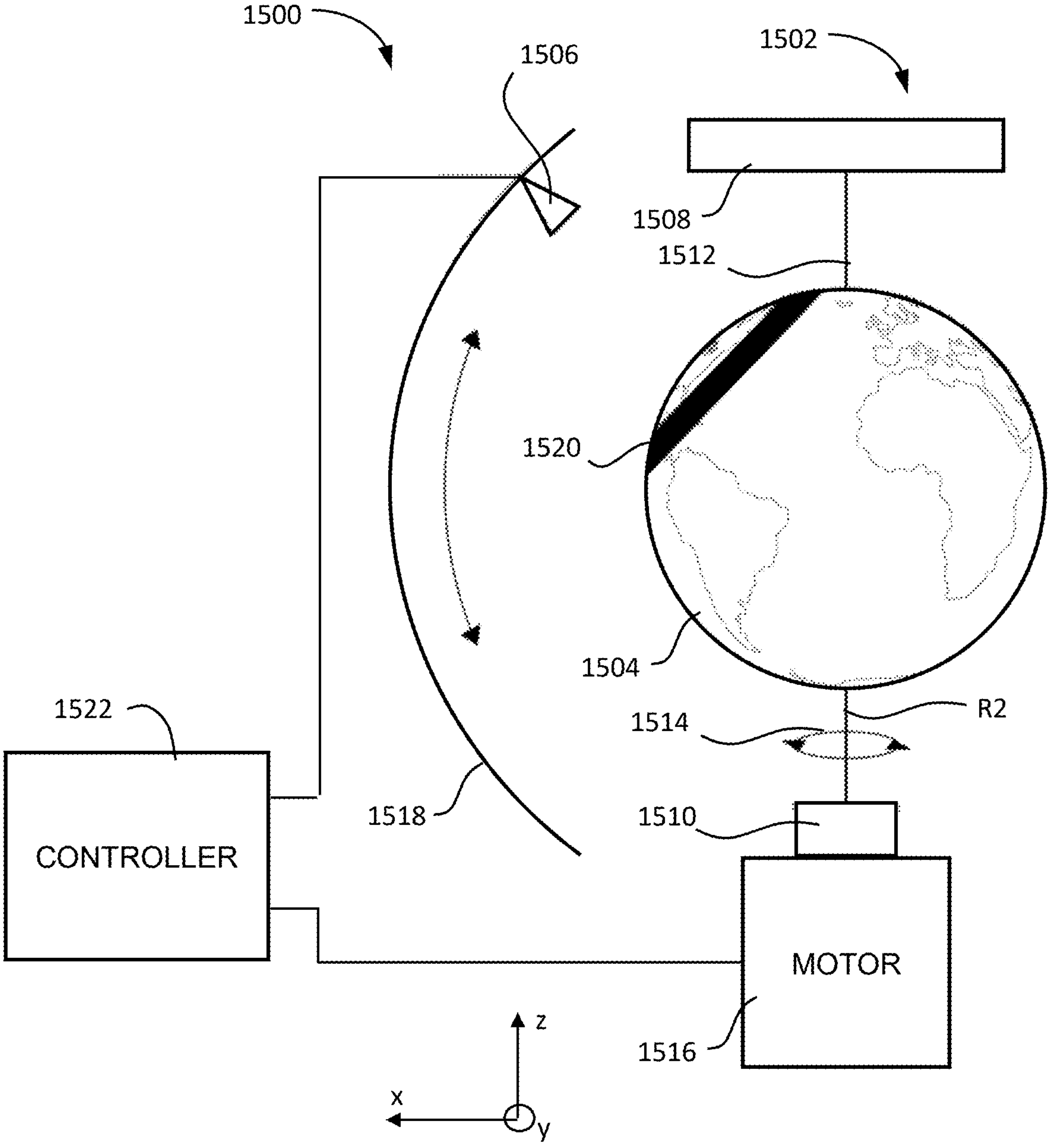
FIG. 15 is a schematic diagram of an example lathe contour photolithography system for placing a curved circuit on a doubly curved substrate according to at least one of the implementations herein.
Figure 16:
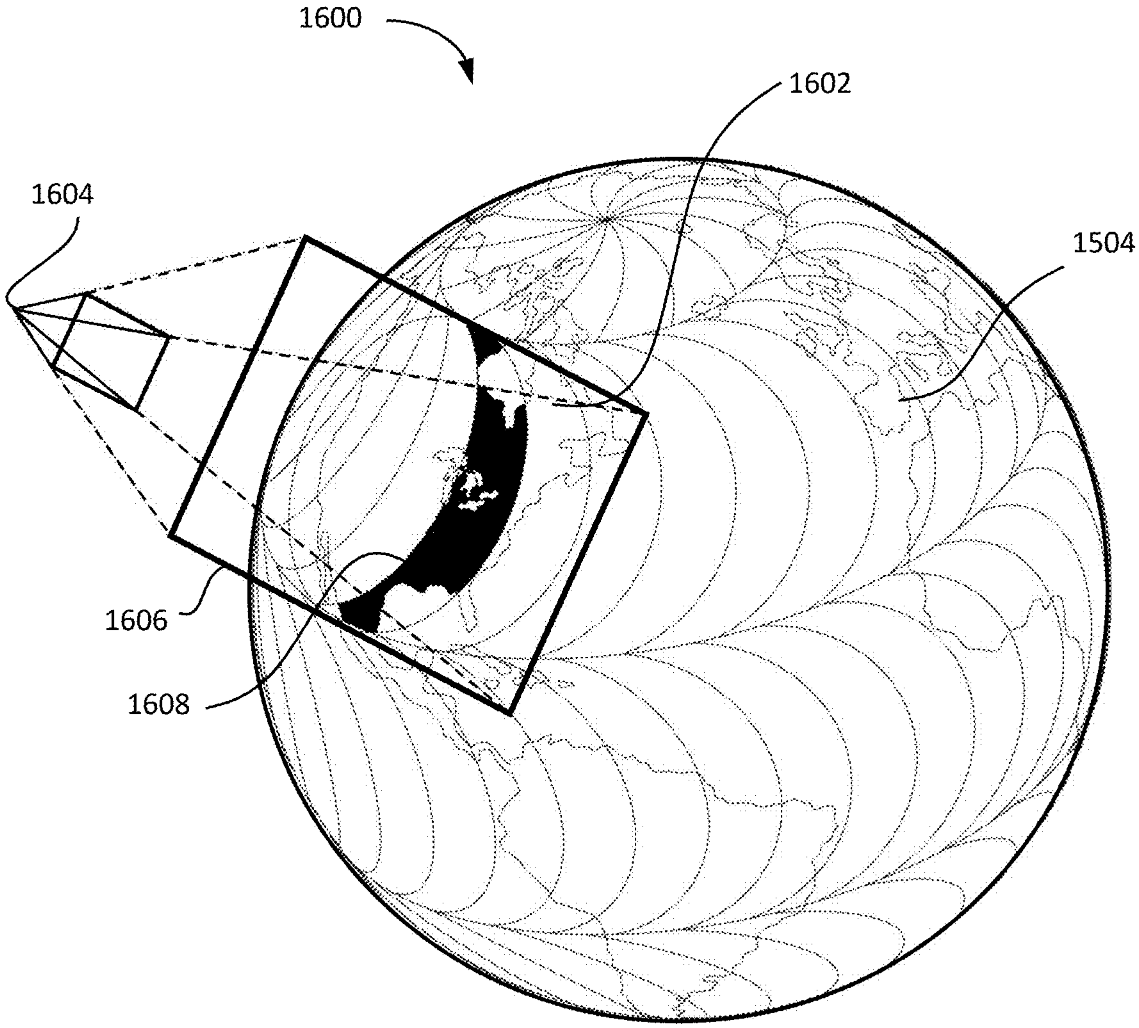
FIG. 16 is a schematic diagram of example light projection for a doubly curved substrate of FIG. 15 according to at least one of the implementations herein.

Referring to FIG. 1, an example apparatus or system 100 for generating curved circuits has a substrate mount 102 shown here supporting a substrate 104 and a light projector 106 aimed toward the substrate 104. System 100 is a milling type of arrangement (or mill setup) that may be used instead of a lathe arrangement (or setup), where each setup provide different substrate motion (rotational versus translation) relative to a focal plane projected by the light projector so the focal plane is scanned over the substrate to a sequence of contour line positions in different motion trajectories. The details of system 100 and methods of generating or printing curved circuits will be described using the mill setup, and the lathe setup will be described farther below (FIGS. 14-16).

In the mill setup, the relative motion between the substrate via motion of the substrate mount and light projector is translation along one or more multiple axes. The motion may be rectilinear using an orthogonal x, y system that moves the light projector 106 and/or substrate mount 102 horizontally in an x and/or y direction, and or vertically in a z direction (as on the xyz axes shown), although milling motions along curved paths can also be used by moving the light projector 106 or substrate mount 102 in more than one direction. Simultaneous movement of the substrate along several axes may be used for some substrate and pattern geometries, but one dimensional movement may suffice in many cases such as linear translation in the x-axis as in the present example of system 100.

In the present implementation, the substrate mount 102 is shown to be adjustable in an x-axis to move the substrate 104 closer or farther from the light projector 106. The substrate mount 102 may have a base 108 supporting threaded brackets 110 and 112 that in turn support a platform 114, and the substrate 104 is mounted on the platform 114. A motor 116 rotates a threaded rod 118 that extends through the brackets 110 and 112 so that rotating the rod 118 moves the brackets 110, 112, platform 114, and in turn substrate 102 axially relative to the rod 118 and closer or farther from the light projector 106. The motor 116 and an end bracket 120 are fixed to rotatably hold the rod 118. Other details of the substrate mount 102 such guide rails and other brackets are not shown for clarity.

The motor 116 may be communicatively coupled to a controller 122, which in turn is communicatively coupled to the light projector 106. The structure for holding and/or moving the light projector is not shown either.

A light ray 128 of the light projector 106 extends to a focal plane 124. The light projector 106 is positioned so that the focal plane 124 of the projected light or image extends transversely to a surface 126 of the substrate 104 where the focal plane 124 intersects the surface 126. A normal or perpendicular line 130 is normal to the substrate 104 at surface 126 that is intersecting the focal plane 124. This forms an incident angle A between the normal line 130 and the light ray 128 that orients the angle of the focal plane 124 with the surface 126. With this arrangement of example system 100, the substrate mount 102 is analogous to a cutting mill machine that moves the substrate axially (referred to herein as axial milling motion) along the x-axis, and the focal plane 124 is analogous to a cutting tool that is moved axially along the substrate.

By one example alternative, baffles 132 are positioned around the substrate surface 126 receiving the focal plane 124 to stop stray and/or reflected light that may result from the light projection and depending on the angle of incidence A of the light striking the curved surface 126. Some light reflection may re-strike the surface 126 or substrate 104 in other areas and cause unwanted exposure of a photoresist. By one form, the baffles 132 may be statically mounted to substrate mount 102 and/or statically mounted on or around the light projector 106. Alternatively, the baffles 132 may be moved independently and in synchrony with the motion of the light projector 106 and/or substrate 104. Automatic movement of the baffles 132, when provided, may be controlled by the same motion control described below.

Now in more detail, the substrate 104 is not limited to any particular object or size as long as circuit printing can be performed as described herein. Thus, the substrate 104 may be part of a vehicle such as an automobile or aircraft, or a projectile that often have doubly-curved surfaces. Thus, by one form and on an aircraft, the substrate 104 may part of a nosecone or nosecone insert, fuselage, or wings, wiring harness replacements, integrated antenna element holders, and/or frequency selective surfaces to name a few examples. The substrate 104 with a curved PCB can be positioned on vehicles for better axis of symmetry to make a moment of inertia more predictable and improve stability and attitude control. The substrate 104 also may be part of compact vehicles such as autonomous drones, other aircraft, watercraft, landcraft, spacecraft, and so forth. The substrate 104 otherwise may be part of any apparatus or object that benefits from a curved circuit. No limitation exists as to the object for which the substrate 104 is a part for any of the examples herein.

Figure 4:
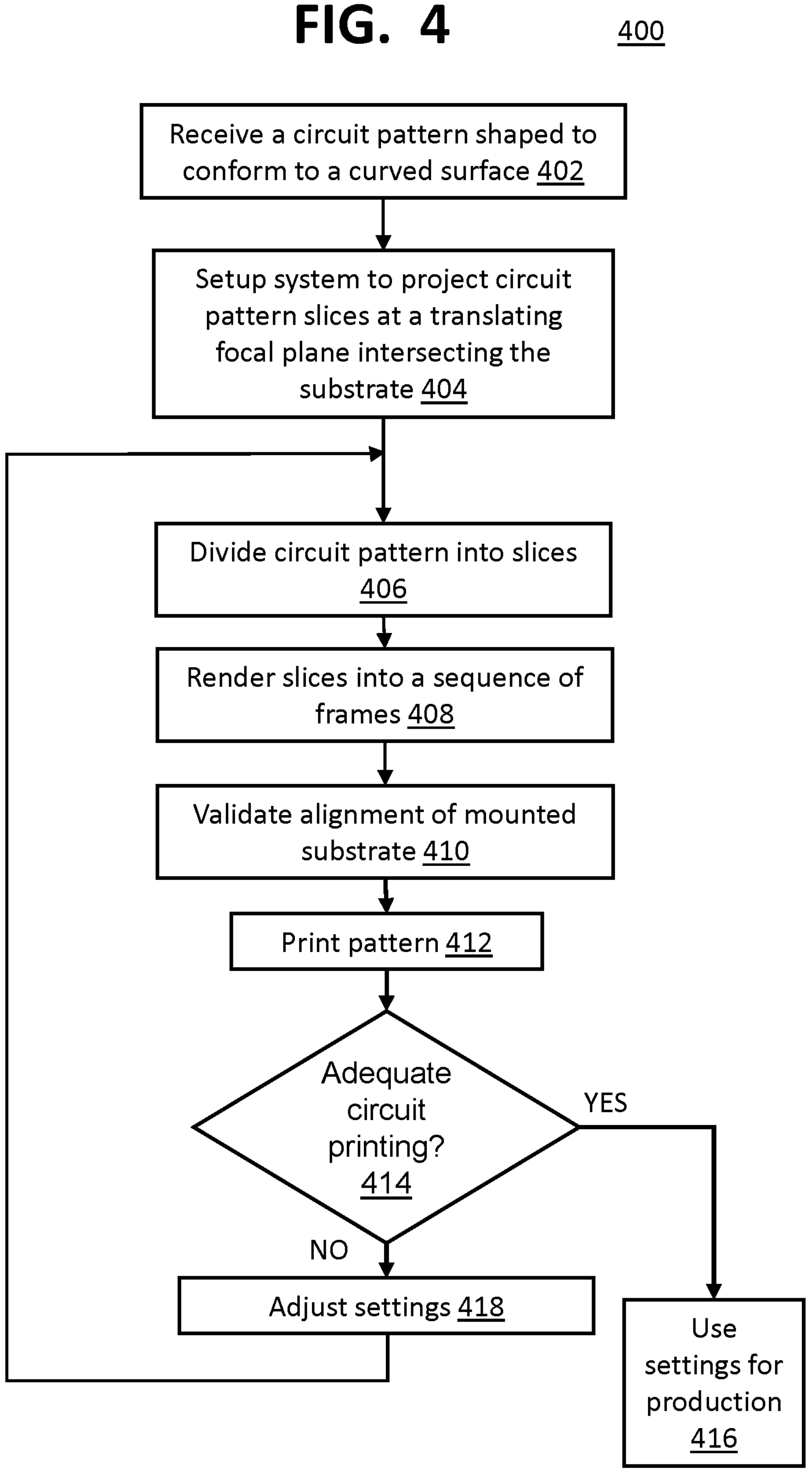
FIG. 4 is an example flow chart of a method of generating a sliced exposure circuit pattern according to at least one of the implementations herein.

In addition, no significant limit exists as to the shape or contour of the substrate to be used to project contour lines to generate a highly accurate patterned light-sensitive layer such as a photoresist. Thus, the circuit pattern slice images and resulting contour lines can have any combination of curves and flats as long as a light projector has the parameters and orientation to project an entire contour line without shadows as explained in greater detail below with process 400 (FIG. 4).

While the motor 116 rotates the rod 118 to generate axial motion that axially translates the platform 114 and substrate 104, many different mechanisms may be used instead as long as the motor 116 can move the substrate 104 in a desired direction relative to the focal plane 124 and at sufficiently controlled increments and/or speed. It will be understood, however, that such a motor 116 may alternatively or additionally be provided and attached to the light projector 106 to move the light projector in addition or instead. In a lathe setup, a motor may be provided to rotate the substrate as well, and in either the mill or lathe setup, the light projector also may be mounted on a motorized gimbal (or rotating mount) to modify and control an attitude of the light projector, and in turn orientation and position of the focal plane, with respect to the substrate. Additional details for the lathe setup are described below.

The example motor 116 here may be an electronic stepper motor system used to linearly translate the substrate 104 in controlled increments or a servo-type motor or other motor that provides a more continuous motion of the substrate 104 to coincide with fast frame rates and fast exposures. Specifically, motion control with micrometer accuracy may be used in both the mill and lathe implementations in order to take full advantage of the resolution of the projectors. Motion control systems with this level of accuracy are available and are compatible with control software. In the mill implementations of system 100, the motor 116 may be a stepper motor that moves the substrate 104 linearly, and brings the substrate 104 to a complete stop before the next frame is exposed. Typically, motion control is arranged to factor inertia, acceleration, and velocity in addition to position of the platform 114 and in turn substrate 104.

In contrast, however, both the lathe and mill implementations can be arranged to use dynamic motion control rather than stepper motors. In this case, the substrate is always in motion during a total light projection duration of a sequence of frames so that exposure time for individual frames should be sufficiently fast to minimize blur. DLP photolithography systems can be used to expose patterns while substrates move quickly on an assembly line, for example. Thus, light projectors and photoresists with a sufficiently fast exposure time to minimize motion blur can be used.

Furthermore with regard to the dynamic motion control, motion blur at the substrate can be factored, similar to the nature of cutting tools on mill or lathe setup. Particularly, each pixel in a pixel array surface at the light projector becomes a scan line instead of just a point, and this is factored into the arrangement of the aforementioned assembly-line example. Motion blur, when properly accounted for, does not significantly reduce useable resolution since the start and stop of the pixel scan line can be predicted precisely, unlike the type of blurring that occurs outside of the depth of field of the focal plane. Thus, if dynamic motion control is used, the image frames should be rendered to account for the slight movement of the substrate during the exposure. When properly executed, the controller will synchronize the motion of the substrate to the projector exposure timing and rate, and the process can proceed quickly and continuously, analogous to a video sequence of frames.

The light projector 106 may be a high resolution DLP light projector, photolithography projector, or stereolithography projector. Light projectors can be adapted by using DLP chips. Such light projectors may provide 4K resolution, although other or lower resolutions can be used depending on circuit pattern size and desired detail level. The light source used to illuminate the DLP chip or DLP light projector may be about 365 nanometer (nm) ultraviolet (UV) wavelengths or other suitable wavelengths compatible with the photoresist being used including visible light wavelengths.

As to the projection lenses for the light projector 106, many available lenses and lens systems can be used for the contour photolithography and contour line projecting described herein. Lens choice depends upon the projector used, the substrate size and geometry, and the circuit pattern to be exposed.

Some of the parameters to be considered for selection and use of the light projector 106 are (1) throw length which is the distance from the front of the lens to the focal plane, (2) depth of field (also referred to as a depth of focus or DOF) which is the distance range over which an image is in focus at the focal plane, (3) angle of incidence to place the light projector and/or aim the lens so that the resulting focal plane has a certain angle relative to a surface of the substrate, (4) the object distance between the lens and the frame (or projection circuit pattern slice image on a frame) at the light projector, (5) the image distance between the lens and the surface of the substrate intersecting the focal plane, and (6) frame size (including resolution and pixel size).

The throw length should be sufficiently long to allow movement of the light projector 106 and/or substrate 104 toward each other to capture all contour lines before the light projector and substrate or substrate mount contact each other that blocks further desired positioning of the substrate.

In order to better ensure maximum light intensity and image sharpness, the depth of field should be small, and by one form, may be less than or equal to about 100 micrometers. When the light intensity is increased where needed at the focal plane, this permits a shorter exposure frame and shorter duration that the light projector iris is open, thereby reducing energy consumption. For a more precise DOF setting, the optical systems used for maskless photolithography using digital light processing (DLP) project light onto a focal plane which is nearly flat, within a depth of field or depth of focus, Δf, that is a narrow sliver relative to the throw length from the lens of the projector to the substate surface, where:

$$\Delta f = \frac{2da\Delta x}{a^2 - \Delta x^2} \approx 2d\frac{\Delta x}{a} \quad (1)$$

and where Δx is the projected pixel size, a is the aperture size of the lens system, and throw length is d. Outside of the defined depth of field, light from adjacent pixels begin to overlap, blur occurs, and the finest resolution scale is lost. The limiting factor that makes depth of field narrow is therefore the desired resolution pixel size, or more precisely, the ratio of pixel size to aperture size, Δx/A. Projected pixel size is usually much smaller than the aperture size, so that Δx/a<1, given the approximation shown in Eq. (1). Reducing the aperture size a widens depth of field, but also reduces light intensity, requiring a longer exposure time. In practice, 2d/a is greater than unity, usually close to a factor of ten, so the depth of field can be ten times pixel size. Increasing the throw length, d, increases depth of field, but it also results in larger projected pixel size and less resolution. Taking all of this into account, photolithography projectors with 20 micrometer resolution and 50 cm throw length may be used here with an 80 micrometer (0.08 mm) DOF, 70 to 90 micrometer DOF, or exactly 80 micrometer DOF. Other example depth of fields may be up to 100 micrometers, or up to 500 micrometers. This depth of field provides a depth of high resolution focus at the focal plane.

Another optical parameter to be controlled for contour photolithography is the angle of incidence between the focal plane and the surface of the substrate. Conventional photolithography on flat surfaces is performed at zero angle of incidence (but only at the center of the image), whereas with the disclosed method and system, angle of incidence varies. If the angle of incidence A of light rays striking a substrate surface 126 is at zero, the focal plane becomes, or comes close to, parallel to the surface 126 and will contact the photoresist outside of the focal plane where the projected images are out of focus. However, in the present method and system, since only a contour line is being projected in the disclosed system within the focal plane, the circuit pattern strip within the contour line remains in focus, and a photoresist can be exposed at the contour line to be shaped with a high quality pattern. However, if the angle of incidence A of light rays striking the substrate surface 126 becomes too high (such as 90 degrees where the focal plane is at or close to perpendicular to the surface 126), light rays from the light projector parallel to the surface 126 are in contact with the photoresist in this case as well. This can result in undesired light scattering and unacceptable pattern smearing.

Specifically, light does not entirely behave like an ideal ray, where the angle of reflection equals angle of incidence. Some of the reflected light scatters randomly, and this random scattered light can skirt along the surface and cause unwanted exposure. The amount of scattering is greater for rough surfaces, but even a mirror finish will still scatter light. In addition, a photoresist material or layer on the substrate can increase scattering, but also trap light due to total internal reflection.

One way to minimize any smearing effects due to scattering or total internal reflection is to minimize angle of incidence. Thus, by one form, and depending on substrate geometry and the pattern desired, a milling motion or a lathe motion should be selected and planned to set the angle of incidence A of the light in a desired range, and this can be determined by experimentation. For one example form for many geometries and as an extremely safe range, the angle of incidence A is set to (as a planned angle) remain at or below 10 to 15 degrees. By other example limits, however, the angle of incidence A may be up to 45 degrees or even 75 degrees. Also, the exact maximum useable angle of incidence A on a photoresist (or light-sensitive) thickness, surface finish, surface curvature or the topography of the light-sensitive layer, and other variables and must be evaluated on case-by-case basis by experimentation.

Other parameters to be set are the object and image distances. As mentioned, the image plane is positioned where light rays passing through the frame (or slide) with the circuit pattern slice image at the light projector 106 converges to form a sharp, focused image, and this is the image distance. When an image is in focus, all of the light from a point on the object passes through the lens and converges at a corresponding point on the image plane, creating a sharp image. Thus, the object distance and focal length determine where the image plane, and in turn, the sharpest focus of the projected image, will be located. It is part of the optical system's overall configuration, which also includes the focal length of the lens. These distances are related by the lens equation:

$$\frac{1}{f} = \frac{1}{do} + \frac{1}{di} \quad (2)$$

where f is the focal length of the lens, do is the object distance (distance from the slide or frame to the lens), and di is the image distance (distance from the lens to the substrate). Throughout this document, we often use the term focal plane to refer to the image plane where focused light is projected.

By one implementation with regard to frame size, frame size is limited by the arrangement of components at the light projector and is often determined by the size of the DLP chip, if being used, and the lens system. A light projector may have an array of light emitting pixels each with one or more photodiodes and forming a light emitting surface that determines the resolution of frames being projected. A frame resolution is measured in pixels, and usually in a length L×width W arrangement. The frame size itself, versus the resolution, limits the maximum circuit pattern size that can be exposed in one pass and is the physical dimensions of the frame or array surface measured in inches or millimeters for example, and depends on the size and spacing of the pixels in addition to the number of pixels. A resolution should be used that depends on the substrate being exposed and the size of the circuit pattern. Thus, a substrate with a large size and a coarse circuit pattern may be adequately printed with a lower resolution. In the case of a large circuit pattern, however, the frame size may need to be large to efficiently capture a sufficient area of the circuit pattern. In contrast, when the light projector is to expose a small circuit pattern, then a smaller projector with a smaller frame size and higher resolution may be used. The frame size and resolution also may change depending on the size and type of lens that is being used.

By another alternative, large circuit patterns that exceed the extent of a single frame can be exposed with long, sweeping paths using multiple light projectors moving in parallel to widen the swath being exposed. For finer work, a light projector with a shorter lens that produces a smaller, higher resolution image can be moved closer to perform more exposures while the substrate is still mounted and aligned on the same fixture. Many variations are contemplated.

Figure 2:
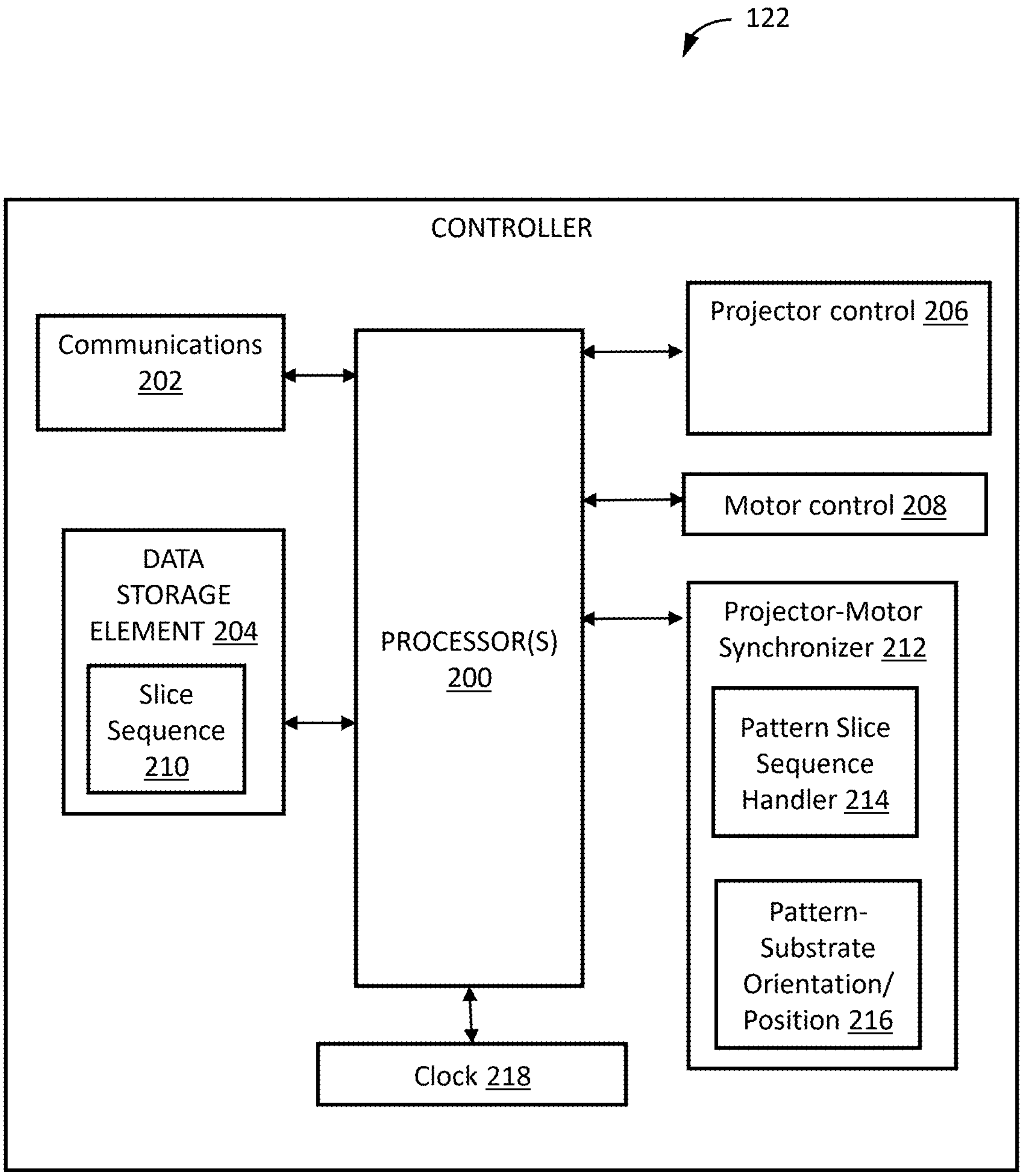
FIG. 2 is a schematic diagram of an example controller of the system of FIG. 1 and according to at least one of the implementations herein.

Referring to FIG. 2, the controller 122 is arranged to operate the system 100 to print the curved circuits according to one or more contour photolithography implementations described herein. The controller 122 has a processor 200, a communications unit 202, a data storage element 204, a projector control unit 206 to control the projector 106, a motor control 208 to control the motor 116, a projector-motor synchronization unit 212 with a pattern slice sequence handler unit 214 and a pattern-substrate orientation/position unit 216. Slice sequences 210 may be stored in the data storage element 204.

The projector control unit 206 receives instructions for operating the light projector 106 including uploading circuit pattern slice images (or frames) data to be displayed or projected, sending signals to operate the pixel array to project the images slice by slice, operating any physical or electronic (or virtual) shutter to control an exposure duration, receiving and operating any other settings like focus or lens position for an adjustable lens, and so forth. The projector control unit 206 may be wholly or partly located at the light projector 106 itself rather than, or in addition to, one or more controllers 122 that are not at or on the light projector 106.

By a possible alternative form, the light projector may still use reticles disposed in front of the pixel surface when desired and rather than projecting circuit pattern slice images from the pixel array or surface. In this case, an entire circuit pattern may be emitted at the pixel surface (or all pixels may be set to emit light the array or another light source), but a reticle may be positioned in front of the pixel surface so that only a slice or contour line is actually projected out of the light projector and light from the remainder of the circuit pattern is blocked. Otherwise, the examples herein relate to the uploading of data of a temporal sequence of frames of circuit pattern slice images to the light projector 106 to use the pixel array surface of the light projector to project a frame of a circuit pattern slice.

The motor control 208 receives instruction signals for operating any of the motors used to move the substate in this example, but alternatively or additionally, any motorized bases, mounts, gimbals, supports, and so forth that may be used to move and position the light projector 106 as well. This may include any lathe setups that rotate the substate as in FIG. 16 for example. The motor control 208 sends signals to the motors 116 (and/or other motors) to then perform the desired actions or motions.

The projector-motor synchronization unit 212 (or just sync unit) coordinates the signals to send to the light projector 106 to upload (if not already received) image files for each exposure to the light projector and expose a single frame, and then signals to the motor 116 to move the substrate 104 a small distance after the exposure so that the focal plane 124 is positioned to expose a next circuit pattern slice. This process repeats until the entire circuit pattern is exposed. For a DLP light projector, the sync unit 212 receives a light intensity setting and an exposure frame duration to flash and that is signaled to the light projector 106 to perform at those settings. Thus, the frame rate for advancing frame to frame (or slice to slice) may be set to coordinate with the signaling of motion for the motor 116, and this may be very small incremental amounts such as the width of the contour lines (or depth of the focal plane).

In example implementations, the processor(s) 200 is at least one processor formed by processor circuitry and includes the hardware, software, and/or firmware components configured to operate any of the units of controller 122 and any other units described herein, to facilitate communications and/or interaction between the elements of the system 100, and to perform additional tasks and/or functions to support operation of the system 100, as described in greater detail below. Depending on the implementation, the processor 200 may be, or have, a general purpose processor such as a central processing unit (CPU), a content addressable memory, a digital signal processor, an application specific integrated circuit, a field programmable gate array, any suitable programmable logic device, discrete gate or transistor logic, processing core(s), discrete hardware components, or any combination thereof, designed to perform the functions described herein. The processor 200 may also be implemented as a combination of computing devices, e.g., a plurality of processing cores, a combination of a digital signal processor and a microprocessor, a plurality of microprocessors, one or more microprocessors in conjunction with a digital signal processor core, a System on a Chip (SoC), or any other such configuration or combination. In practice, the processor 200 includes processing logic that may be configured to perform the functions, techniques, and processing tasks associated with the operation of the system 100 and the controller 122, as described in greater detail below. The light projector 106, or otherwise the processor 200 itself operating other units not shown, may include the use of at least one shared, dedicated, or fixed function graphics processing unit (GPU), image signal processor (ISP), and so forth. Furthermore, the operations of a method or algorithm described in connection with the implementations disclosed herein may be embodied directly in hardware, in firmware, in a software module (or unit) executed by the processor 200, or in any practical combination thereof. For example, in one or more implementations, the processor 200 includes or otherwise accesses a data storage element (or memory) 204, which may be realized as any sort of non-transitory short or long term storage media capable of storing programming instructions for execution by the processor 200. The code or other computer-executable programming instructions, when read and executed by the processor 200 (or computing device), cause the processor 200 to support or otherwise perform certain tasks, operations, functions, and/or processes described herein.

The data storage element 204 or another memory may store one or more slice sequences of circuit pattern slices (or more precisely, data of circuit pattern slices to be projected). Any other data related to the circuit printing may be stored at the data storage element 204 or another memory as well, and including code or data of any of the circuit printing applications, programs, units, and/or modules mentioned herein, operating systems operated by the controller 122, and so forth. Depending on the implementation, the data storage element 204 and other memory used herein may be physically realized using RAM memory, ROM memory, flash memory, cache, registers, a hard disk, or any another suitable data storage medium known in the art or any suitable combination thereof.

Otherwise, any of the units of controller 122 may be considered to be formed of hardware, firmware, or software, or any combination thereof to perform the function or functions of the unit or module (including the processor(s) 200) as described above. The physical location of any of the units of the controller 122 may be at the same location within the same computing device, system, or server, or may be spread to remote locations and communicating with each other as needed to perform tasks described herein or other tasks, and may be linked to each other over a computer network, telecommunications network, cloud network, the Internet, wide area network (WAN), local area network (LAN), personal area network (PAN), and so forth and by using one or more communications unit 202 where relevant.

In an overview of the operation of system 100, the controller 122 synchronizes the motion of the motor 116 with the projection of frames at the light projector 106 so that, in an initial position of the substrate, a light projector shutter flashes open briefly to expose a frame, and then the stepper motor 116 moves the substrate 104 (or light projector 106) a small distance, and the next frame is exposed, and so on. The motor control 208 is electronically synchronized to the projector with a data clock signal from a clock 218. By one form, the data fed into the system is of a sequence of exposure frame image files each with a circuit pattern slice image as well as a sequence of stepper motor commands where one or more of the commands correspond to each frame. If the frame rate is high, the running of the sequence of exposures and motion of the substrate 104 will appear to be a continuous scan, such as with a video sequence of frames. As another alternative, data of a compound sequence of motions may be generated and provided to controller 122 so that the substrate 104 and/or light projector 106 are moved along multiple different axes of translation (and/or rotation for a lathe setup), resulting in complex sweeping and panning motions. The motor control 208 may have a micrometer-level of accuracy for operating the motor 116 to move the substrate 104 repeatability within a certain range of motion. Once the exposure and motion sequences have been performed, the result is a curved light-sensitive material or layer, such as a photoresist on the substrate 104 that is ready for development and subsequent operations to finish and use a curved circuit on the substrate 104.

Figure 3:
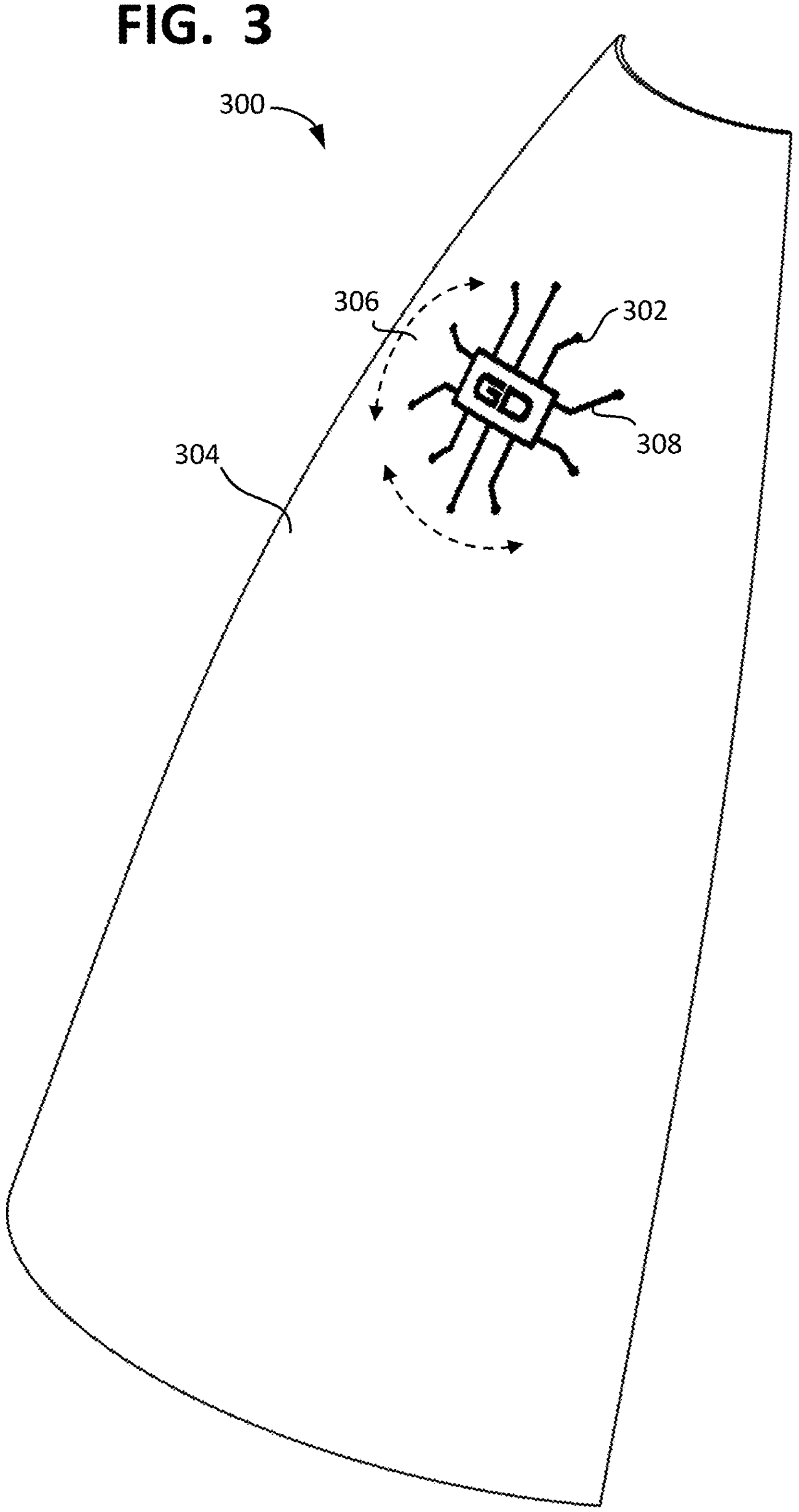
FIG. 3 is a schematic diagram of an example curved circuit pattern on a substrate according to at least one of the implementations herein.

Referring to FIG. 3, the substrate 104 may be an example substrate 300 shown here with a complete curved conductive circuit 302 deposited on the substrate 300 and that has a conformal circuit pattern 308 to arrange metal traces and any other metallization that is to form the pattern 308. The circuit pattern 308 is used for the example method implementations described below, such as for processes 400, 500, and 600. In this example, the substrate 300 may be part of a nosecone insert with the circuit 302. By one example form, the substrate 300 is about eight inches in length and may be a subassembly that can be bonded to the interior of a full nosecone. Because the substrate 300 lacks rotational symmetry, the substrate 300 is an example of the type of substrate better suited for milling motion of system 100 than a lathe setup (FIGS. 14-16). It should be noted that the location of the circuit pattern 308 on a body 304 of the substrate 300 very well may have a doubly-curved surface 306 that is convex in both a vertical direction and a horizontal direction as represented by the dashed arrows.

Referring to FIG. 4, a process 400 for generating and validating curved circuit pattern slices of a circuit pattern for circuit printing or depositing for contour photolithography is described according to at least one of the implementations herein. The process 400 includes operations 402 to 418, generally numbered evenly. Systems, apparatuses, and devices of any of FIGS. 1-3 and 5-16 may be referred to for process 400 where relevant.

Process 400 may include "receive a circuit pattern shaped to conform to a curved surface" 402. The circuit pattern may be generated on a computer aided design (CAD) application. The circuit pattern should be one that is to be singly-curved or doubly-curved but otherwise has no shape limits as to the contour of the circuit pattern and surface of the substrate for the present methods, as explained in detail below. An example doubly-curved circuit pattern 308 is shown projected onto a substrate 300 (FIG. 3) and as described above. The printed circuit then may be provided to the contour photolithography system described herein such as with system 100 (FIG. 1) in the form of a circuit pattern data file.

Process 400 may include "setup system to project circuit pattern slices at a translating focal plane intersecting the substrate" 404. This operation may involve selecting a light projector, selecting a lens for the light projector, setting the light projection parameters on the light projector, determining and establishing the light projector mount and movement capabilities of the light projector if any are to be provided, setting and establishing the substrate mount structure and movement capabilities, and determining the motion geometry to be used to scan a focal plane along the substrate to receive the printed circuit.

By one example implementation, the light projector may be aimed in a way that minimizes the overall angle of incidence (AOI) across a given contour line and/or across the entire circuit pattern, and will be set on a case-by-case basis such as by a geometric analysis in CAD. Usually, the center of the circuit pattern will be where the AOI is minimized. However, the aiming and focal plane AOI also should be set so that the entire circuit pattern remains within the image frame as the focal plane is scanned along the substrate. To accomplish this, a larger AOI may be used instead. Thus, for one possible example frame size of 25×45 mm image frame, a maximum 10 to 15 degrees AOI may be used to enable exposure of all circuit pattern slices of a single circuit pattern in one straight-line swipe. When multi-axis control exists or the analysis and/or graphics processing establishes non-parallel circuit pattern slice images of sequential frames, then this permits more complex trajectories that minimize the AOI. Generally then, while the set or planned AOI should be minimized, it is not always required. Thus, the maximum planned or set AOI depends on the size of the image frame, the outer dimensions of the circuit pattern, the shape of the circuit pattern, and the motion path of the focal plane that should be used. The maximum usable AOI may depend on surface finish and photoresist properties. As long as every point on the circuit pattern has an AOI that falls within the maximum and minimum set AOI as mentioned, the light projector angle and motion scheme should be adequate.

As a result, if the maximum useable AOI is greater than the planned maximum AOI encountered for a given planned motion, then that arrangement should work and the present system and arrangements establish a range of intermediate AOIs permitting the use of wide circuit pattern slices and in turn wide contour lines exposed along simple motion paths that maintain the entire circuit pattern within the image frame. When such a single arrangement is not found, then the circuit pattern may be divided into multiple separate circuit pattern regions. It should be noted, however, that in one form of this system, the focal plane should not be perpendicular to the substrate surface (and the AOI so large that the light ray of the AOI is parallel to the surface) since this position causes too much light scattering from the projected light contacting the substrate surface. However, it is possible to have a point on the substrate surface parallel to the focal plane when the focal plane is being swept along the substrate surface depending on the shape of the substrate surface and photoresist.

Process 400 may include "divide circuit pattern into slices" 406. As mentioned, the width of the slices should be equal to or smaller than the depth of field (or depth of focus) of the focal plane so that the projected contour lines stay in sharp, high resolution, high quality focus. By one form, the edge of adjacent circuit pattern slices on the circuit pattern may contact each other or may overlap to ensure no gaps are accidentally created between contour lines. The overlap is particularly useful when consecutive or successive focal planes are not kept parallel either by rotation of the substrate or rotation of the light projector. In one example form, the width of the circuit pattern slices are sized to create contour lines with a width of 80 microns by one particular example. Otherwise, as explained above, the width of the contour lines may depend on the resolution and pixel size at the light projector as explained with equation (1) above. Thus, when a lower resolution can be used with larger pixels, then the depth-of-focus can be deeper (larger), and in turn, the width of the circuit pattern slice and resulting contour line can be wider. By one form, and as mentioned above, the width of a focal plane and contour line may be up to 100 micrometers or 500 micrometers to name a few examples.

As to the shape of the contour line, a surface of the photoresist to have the contour line is free to have an arrangement of one or more flat parts alone, one or more curved parts alone, curved and flat parts together, or any combination or arrangement of these. The contour line also may have curved parts that are singly-curved or doubly-curved as explained above. Thus, the contour line shape may be any shape as long as no overhang exists as part of the contour line or next to the contour line that blocks light from the light projector and from reaching a part of the contour line. This also ignores relatively large dimensions or drops (including dimensional changes in shape) on the contour line such as changes in elevation from one point to another that create sidewalls that create shadows where the light cannot reach positions on the contour line, and so forth. Otherwise the order and arrangement of curves and flats (such as for a random example from left to right along a contour line: a concave part, a flat part, a convex part, a second distinct convex part, other arbitrary hill and valley topography, and so forth) is not limited. This also ignores changes in shape that cannot be used on the contour line where a corner or edge may be too acute or sharp such that the metal or photolithography layers or materials are of bad quality at such corners.

This operation also includes determining the motion control geometry so that the substrate will be moved in a planned direction with planned orientations that position the light projector to aim light at the substrate and that creates a sequence of contour lines in desired positions on a photoresist or other photolithography layer or material on the substrate. As mentioned for a mill setup, the relative motion may be linear (or longitudinal) where the distance between the substrate and light projector changes to linearly move or scan the focal plane along the substrate. The mill setup also may optionally provide translation in lateral and/or vertical directions as well in the xyz axes directions (FIG. 1). An alternative lathe setup (FIGS. 14-16) may have the substrate rotate while the focal plane is projected to the surface of the rotating substrate to scan a focal plane circumferentially around the substrate. Many arrangements may be made to accommodate many different circuit patterns and many different substrate shapes as long as the light projector can project contour lines focused within the scanned focal planes as described. A motion control plan in the form of a data file may be generated that indicates the motion to be established before or after each projected frame. Such data file may be transmitted to the motor control 208 of the controller 122 or directly to motors that are controlling the motion of the substrate and/or light projector.

Referring to FIGS. 7-11, a setup 700 shows the full projected circuit pattern 308 on substate 300 (as with FIG. 3) and is formed by projecting projection circuit pattern slices of a projection circuit pattern shown on frames or slides at the light projector. The projected (or target) circuit pattern 308 is formed of example parallel contour lines including consecutive exposure contour lines 702, 704, 706, and 708 that each represent a different focal plane position to be established as the light projector scans a focal plane along the substrate 300 in a linear direction of a milling setup as with system 100 (FIG. 1). Here, light projected to a focal plane 710 forms darkened contour line 704 as one example. The contour lines 702, 704, 706, and 708 are respectively formed by having the light projector project frames 800, 900, 1000, and 1100 each respectively with a circuit pattern slice image 802, 902, 1002, and 1102 to respectively form the consecutive contour lines 702, 704, 706, and 708.

Process 400 may include "render slices into a sequence of frames" 408, where the frames such as frames 800, 900, 1000, and 1100 described above are generated by dividing the projection circuit pattern into pattern slices as mentioned, and then generating the image data of a frame to display or project a single circuit pattern slice. The frames may have a format expected by the light projector whether in black and white where the white indicates high intensity areas, grey scale to vary intensity, or other colors as desired. The format may have pixel values for each image or frame in an expected color or luminance scheme for example. The frames (or data of the image files) then may be provided to the light projector control for example whether at a separate controller 122 for example as described above, or at the light projector itself.

Process 400 may include "validate alignment of mounted substrate" 410, which may include mounting the substrate on the substrate mount, positioning the substrate in a first position in front of the light projector and aiming (or aligning) the light projector, and adjusting the light projection settings on the light projector. Such alignment may be performed manually by a user entering values into the light projector or controller 122, or may be performed automatically where the light projector control 206 or light projector 106 itself, for example, automatically determines satisfactory light projector settings, position, and/or orientation.

For this operation, the light projector first may be used for a rough alignment to project light to at least one fiducial or alignment mark on the substrate to align the light projector aim with the substrate and to properly position the focal planes. For this purpose, the light projector may project light that does not affect a light-sensitive or photoresist material on the substrate if present already. This may include a non-UV mode of visible light or other wavelengths for example, and may be in predetermined wavelengths such as red. The alignment measurements can compensate for known wavelength of the alignment light.

The projected alignment light, the fiducial, or both may have specific shapes to form the alignment. Thus, the fiducial may have an X or + shape, while the projected light may be a matching shape or may be a ring or spot that is to be centered on the X, plus, or other shape of the fiducial on the substrate as one example. Once it is determined that the light is aligned with the fiducial or fiducials, then it is known that the light projector will be properly aligned with the substrate at least with regard to the aim of the photolithography light. By one form, the position and angle of the focal plane with respect to the substrate can be checked by projecting an alignment pattern onto fiducial lines marked in an area of the substrate external to the location of the circuit pattern on the substrate. Thus, the fiducial may be near but external to the target circuit pattern location or at an outer edge of the substrate.

Once the fiducials are aligned, then a fine alignment stage may include having the light projector take a photograph to determine whether the focal plane is in the correct position by observing whether the resulting photograph is in focus at the target location of the focal plane. The light projector can then be adjusted to obtain a sharp focus at the target focal plane positions on the substrate. The adjustment may be made by changing the lens position on an adjustable lens and/or changing the distance between the light projector and the substrate as mentioned above. As mentioned, the wavelengths of the projected alignment light may be used for this analysis.

By one example form, the rough alignment, fine alignment, or both are performed automatically by the light projector, light projector control, or controller, where an automatic motion control is activated to move the light projector until fiducials are aligned, and/or perform autofocus to achieve sharp focus at the focal plane positions as mentioned. Once the alignment is satisfactory or validated, the light projector is switched to emit photolithography light, such as UV light that affects a light-sensitive layer such as a photoresist.

By one example form, the contour photolithography processes herein also may involve the use of multiple light projectors or switching out the lens on a single light projector to perform the light projection operations for one or more iterations of process 400 (and/or 500 or 600) described herein. In this case, aiming of the light projector involves aiming at least two light projectors or a single light projector with replaceable lenses with at least one light projector or lens to construct course circuit pattern structure and at least one second light projector or lens to construct fine circuit pattern structure. Many variations are contemplated.

Process 400 may include "print pattern" 412 by projecting each frame in a temporal sequence where each frame has a circuit pattern slice. This includes synchronizing the motion of the substrate, light projector, or both between the projection of consecutive frames. Since each frame has a different circuit pattern slice, the circuit pattern slice is projected to a focal plane at a desired focal plane position on the light-sensitive material or photoresist on the substrate. Each or individual projected circuit pattern slice at a focal plane forms a different contour line at a different location on the substrate forming a row of the contour lines when a linear mill setup is used. This may be performed in a small duration of light, similar to a flash of a light, to form a contour line and expose the photoresist at the contour line. The focal plane is scanned along or over the substrate and photoresist layer or light-sensitive material after an individual contour line is exposed on the substrate. This may include translating the substrate in a mill setup as in system 100 or rotating the substrate in a lathe setup as described below with FIGS. 14-16 described below. Thus, the projection of the frames results in a sequence of contour lines each forming a part of a circuit pattern on the light sensitive material on the substrate, thereby simultaneously exposing the light-sensitive material to pattern the light-sensitive material. By one form, this results in a patterned photoresist layer or material on the substrate that can be used to then pattern a metal layer or material under the photoresist layer.

Figure 12:
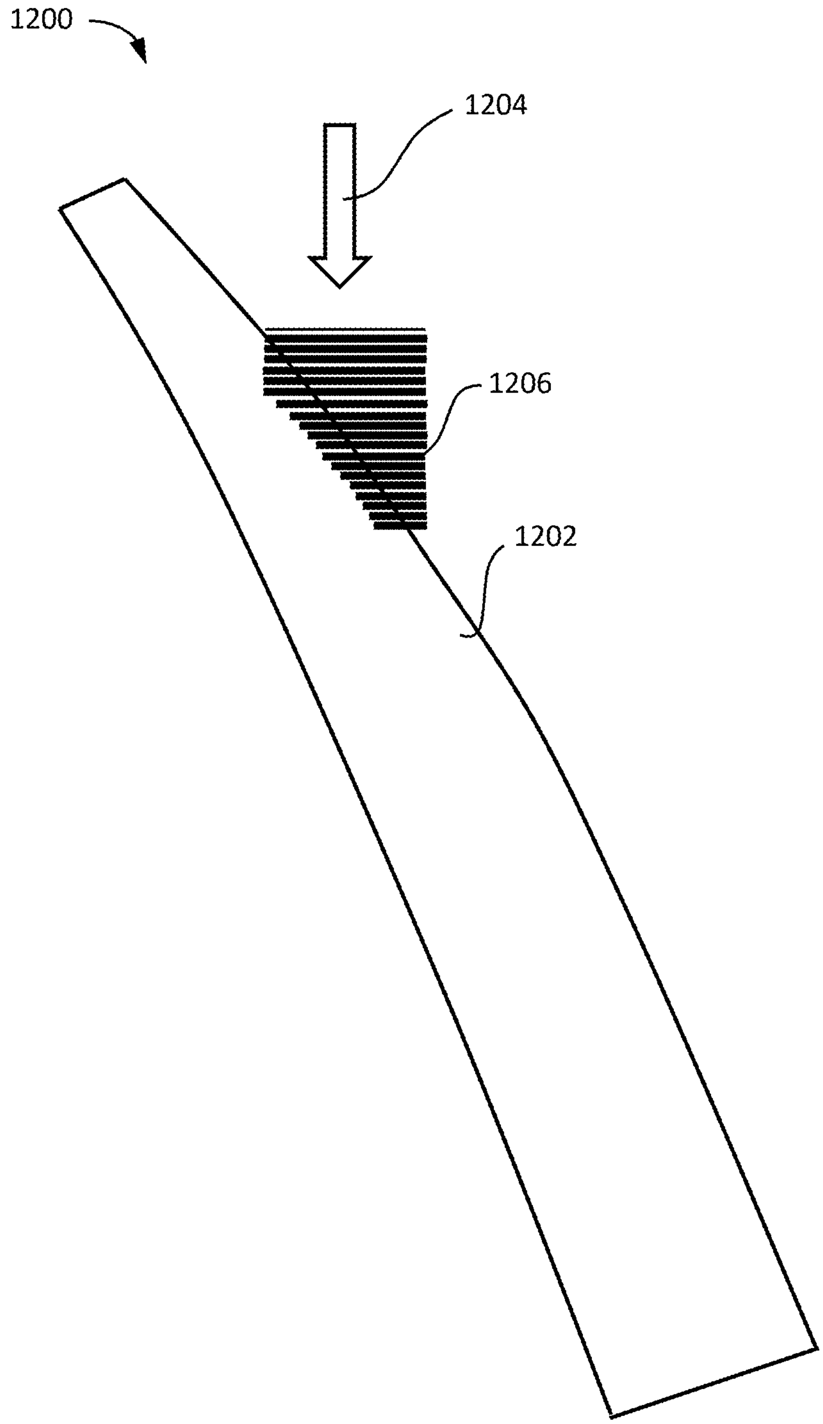
FIG. 12 is a schematic diagram of a side view of a substrate showing a sequence of focal plane projections according to at least one of the implementations herein.

Referring to FIG. 12, another example perspective of a mill setup with linear substrate and/or light projector motion shows a side view of a substrate 1202 in a mill setup where light is projected from the light projector (not shown here) in the direction of arrow 1204. As the distance between the substrate and the light projector is changed, whether closer or farther apart, a sequence of focal plane positions 1206 in a linear array are formed, where a contour line is projected and the photoresist beneath the contour line is exposed at each focal plane position 1206.

Figure 13:
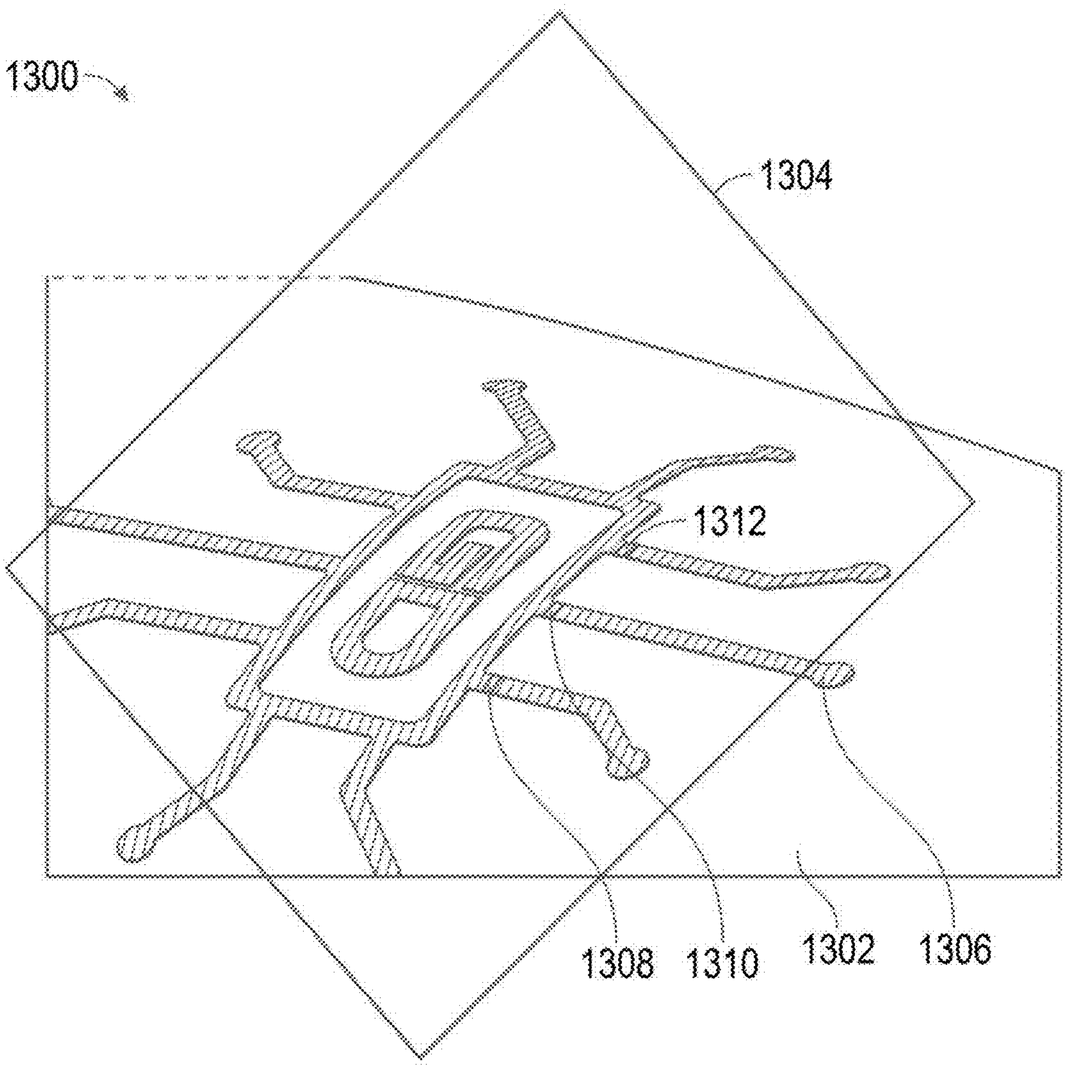
FIG. 13 is a schematic diagram of a perspective view of a focal plane and contour line forming a cross-section at a curved circuit pattern on a substrate according to at least one of the implementations herein.

Referring to FIG. 13, an example focal plane position setup 1300 shows a projected focal plane 1304 that intersects a substrate 1302 at a contour line of an entire example circuit pattern 1306 overlaid on the substrate and divided into the contour lines for explanatory purposes. The example here shows a projected contour line at the focal plane 1304 that is active or present only at three trace intersections 1308, 1310, and 1312 of the circuit pattern 1306 so that only these three locations under this contour line is changed to a soluble (for negative exposure) or non-soluble (for positive exposure) state to subsequently remove the non-pattern spaces between the circuit pattern of the photoresist during development.

By one form, this slice by slice or contour line by contour line operation is performed in order from one end of the circuit pattern to an opposite end of the circuit pattern and as provided by the order of the frames and that may be the most efficient order with regard to moving the substrate relative to the light projector. It will be appreciated, however, the substrate motion and synchronized frame projection (and subsequent photoresist exposure) may be out of a linear order (or out of a circumferential order for a lathe setup) where the frames and motion jump around to non-consecutive contour line and focal plane positions on the photoresist when desired.

Process 400 may include the inquiry "adequate circuit printing?" 414, where the resulting patterned photoresist material or layer (or other patterned light-sensitive material or layer) is measured and compared to threshold target dimensions. Otherwise, the construction may be completed using the patterned photoresist including subsequent development and fixing and etching of the metallization of the circuit. The resulting circuit structure is then compared to thresholds such as circuit dimension and position targets including the quality of the operation and robustness of the resulting circuit and so forth. Other tests and criteria may also be used.

When the printed circuit is found to be satisfactory, process 400 next may include "use settings for production" 416, and system 100 or other system with the light projector and substrate mount setup and parameter settings for these systems that generated to adequate results may be used in mass production for example or production that can use the circuits in a run-time.

When the resulting patterned photoresist or resulting printed circuit is not adequate, then process 400 may include "adjust settings" 418, where the patterned photoresist or resulting printed circuit is analyzed to determine the deficiencies, and appropriate adjustments are made to any of the setup parameters mentioned herein or any other parameter relevant to the contour photolithography explained herein. This may include adjusting any of the settings or parameters including the arrangement of the circuit pattern and circuit pattern slices, which may include the size, shape, contents, specific slice pattern arrangement, and so forth. The process then may loop back to operation 406 to re-slice the circuit pattern if not already done so, and then to perform the subsequent operations to evaluate the revised or adjusted parameters or settings.

Figure 5:
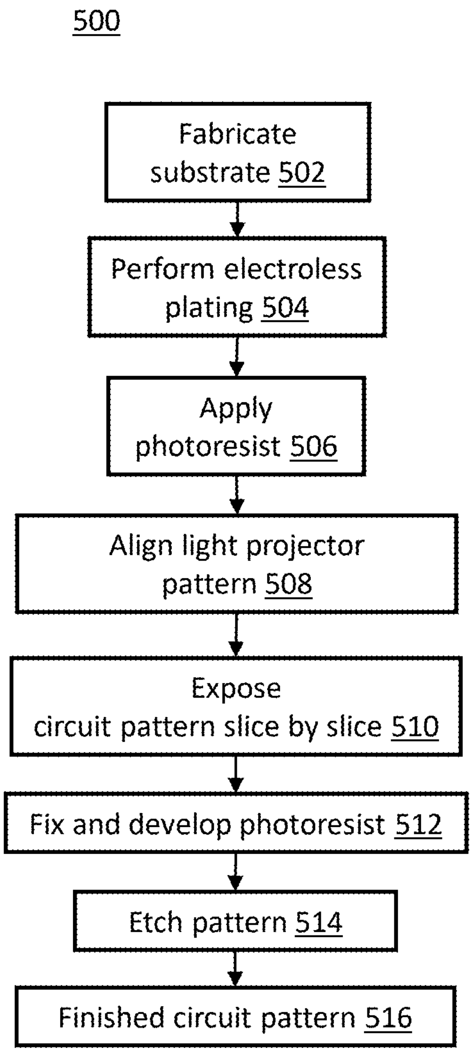
FIG. 5 is an example flow chart of a method of forming a curved circuit according to at least one of the implementations herein.

Referring to FIG. 5, a process 500 for contour photolithography is described according to at least one of the implementations herein. The process 500 includes operations 502 to 516, generally numbered evenly. Systems, apparatuses, and devices of any of FIGS. 1-4 and 6-16 may be referred to for process 500 where relevant.

Process 500 may include "fabricate substrate" 502, where a curved substrate of an object as described above is fabricated, and by one form, may have, or be, or be part of, a PCB, which may be an F4 or FR-4 material. This may be a composite part with a singly or doubly-curved surface as described with FIG. 3 above. By one form, the substrate is a non-conducting dielectric material such as prepregnated glass fiber composite laminate plies, and may be formed additively by layers in a mold and cured under heat and vacuum. However, many other variations may be used instead.

Optionally, process 500 may include "perform electroless plating" 504, while process 600 (FIG. 6) performs electroless plating at a later stage. This may involve a catalyst application where the surface of the substrate PCB is coated with a catalyst, usually a palladium-based compound, which initiates the electroless plating reaction to bond the metal to a non-conductive substrate. Then, electroless metal plating, such as with copper, another metal, or alloy thereof is performed where the substrate may be submerged in an electroless copper plating bath, for example. The bath may have copper ions and a reducing agent, typically formaldehyde, to react in the presence of the catalyst and to deposit a thin, uniform layer of copper onto the substrate.

In one specific example, electroless copper plating of the composite substrate part may be performed as follows in order: surface cleaning, degreasing with an $HNO_3$ solution, rinsing in distilled water, sensitization in an HCL and $SnCl_h$ bath, rinsing with distilled water again, activation with an $AgNO_3$ and HCL bath, rinsing with distilled water again, copper plating bath with a copper ion solution, cleaning with a rinse in $C_3H_6O$ solution, and then distilled water before being heated in an oven. Other variations may be used as well.

Once the plating is complete, process 500 may include "apply photoresist" 506, when a light sensitive photoresist layer or material is being used. Note herein, that the term 'material' is used to include a mass or bulk without being restricted to a particular shape, dimensions, size, and position than otherwise described in context or by the function or name of the material.

A photoresist resin or polymer, such as a UV curable polymer resin, may be used, and such as positive photoresists such as a phenolic resins such as a Novolac resin combined with a photoactive compound such as diazonaphthoquinone, or a negative photoresist may be used such as polyisoprene, bisphenol, or A-based epoxy resin, combined with a photosensitive cross-linking agent. A liquid photoresist or dry film resist can be used. The photoresist material may be deposited by spinning (spin coating), dip coating, spray coating, or other methods to obtain a smooth curved surface while tipping the substrate and using a flexible plastic covering to avoid gravitational effects such as dripping, pooling, or uneven thickness, and so forth. It will be appreciated that this may be an additive process that adds sub-layers to build up a full photoresist layer or material. It also will be appreciated that the process described herein may use other light-sensitive materials that are not necessarily considered a photoresist.

Process 500 may include "align light projector pattern" 508. This operation may include rough alignment and fine alignment as already described above with operation 410 (FIG. 4). Once the light projector is aligned to provide sharp focus focal planes at target focal plane positions on the substrate, process 500 may include "expose circuit pattern slice by slice" 510. This is also described above in detail with operation 412 and as performed by system 100 and controller 122 as one example approach. This includes the synchronization of the alternating projection of the circuit pattern slices to form contour lines at focal planes, and the motion of the substrate to place the focal plane at a next position on the substrate (and in turn a portion of the photoresist).

Process 500 may include "fix and develop photoresist" 512. Here, pattern stabilization techniques may be applied to the exposed photoresist, such as post-exposure baking (PEB), hardening, and so forth to protect small details and edge definition, and increasing durability of the photoresist. Then, the exposed pattern is deposited in a developing solution that dissolves unpolymerized photoresist after exposure. This may include Tetramethylammonium Hydroxide (TMAH), sodium hydroxide (NaOH), deionized (DI) water, solvent developers such as propylene glycol monomethyl ether acetate (PGMEA), organic solvents, alcohol based solutions, ethanol, and isopropanol to name a few examples.

Process 500 may include "etch pattern" 514, where unwanted metal is etched away in a solution such as ferric chloride, leaving the desired trace pattern under the photoresist. The photoresist is then stripped by using a photoresist stripping solvent.

Process 500 may include "finish circuit pattern" 516. This operation may involve adding any other structures to the pattern, such as vias, pads, caps, or any other metallization, and then forming any other materials or layers that are to cover the metallization such as dielectrics, and so forth. This may include repeating the processes mentioned above for multiple stacked layers of alternating metallization in a circuit pattern and dielectric material between the metallization. Many pre and post-exposure variations can be used.

Figure 6:
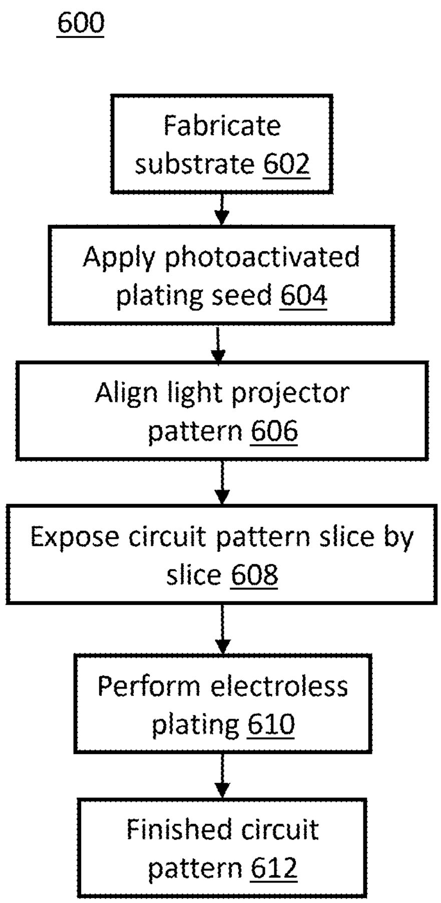
FIG. 6 is an example flow chart of an alternative method of forming a curved circuit according to at least one of the implementations herein.
Figure 7:
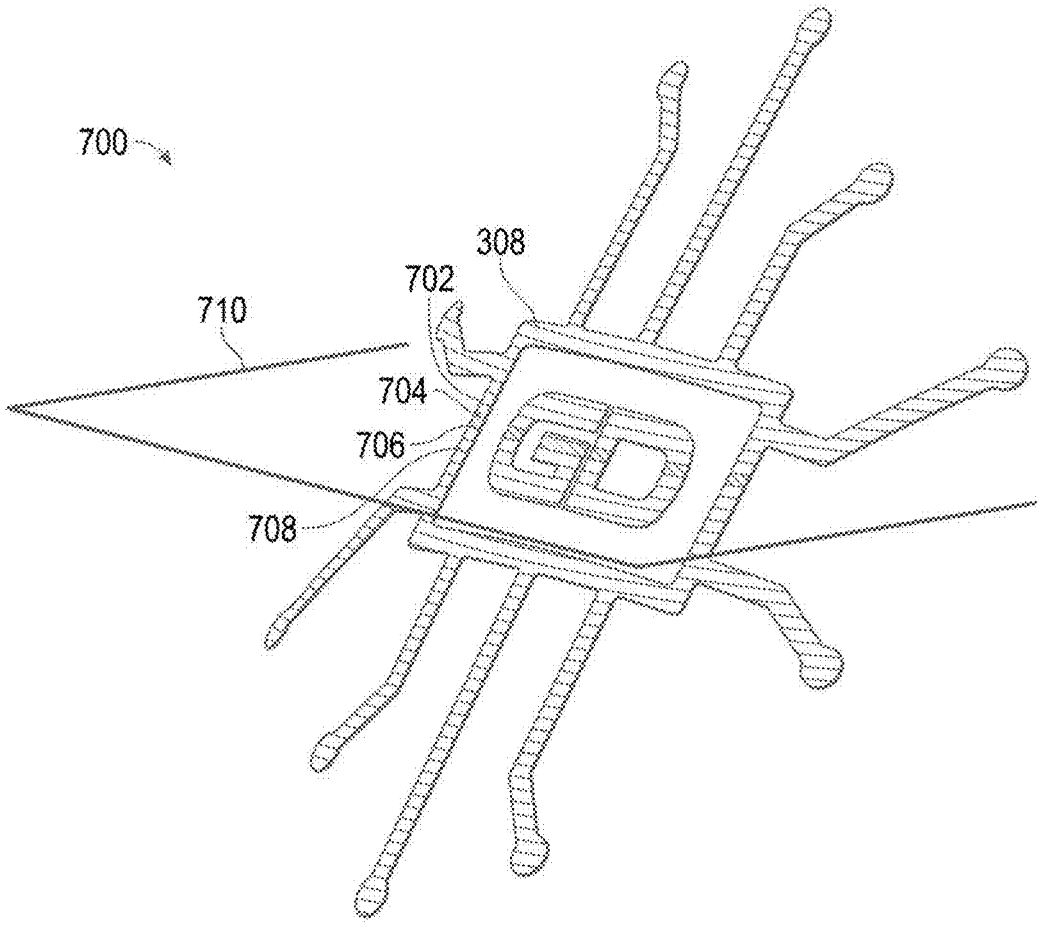
FIG. 7 is a schematic diagram of a close-up view of a sliced and curved exposure circuit pattern according to at least one of the implementations herein.
Figure 8:
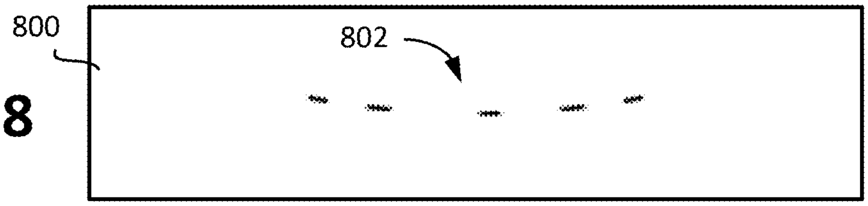
FIG. 8 is a schematic diagram of an example first exposure frame of a circuit pattern slice according to at least one of the implementations herein.
Figure 9:
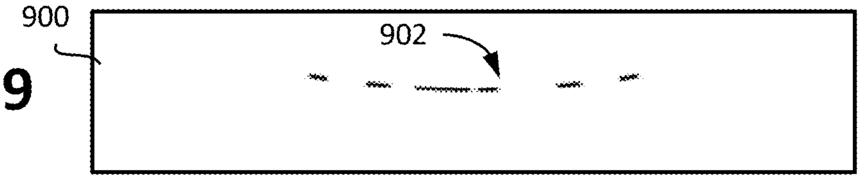
FIG. 9 is a schematic diagram of an example second exposure frame of a circuit pattern slice according to at least one of the implementations herein.
Figure 10:
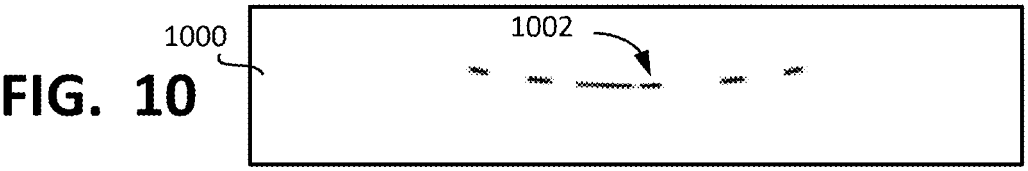
FIG. 10 is a schematic diagram of an example third exposure frame of a circuit pattern slice according to at least one of the implementations herein.
Figure 11:
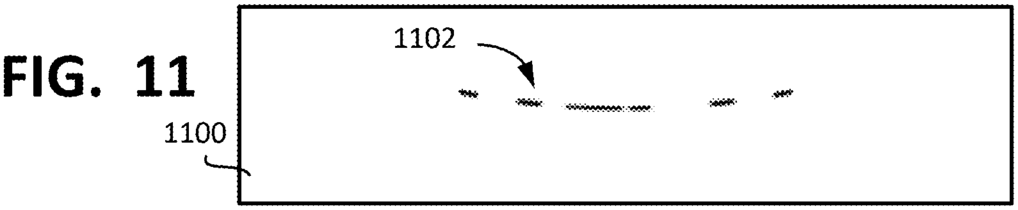
FIG. 11 is a schematic diagram of an example fourth exposure frame of a circuit pattern slice according to at least one of the implementations herein.

Referring to FIG. 6, a process 600 for contour photolithography is described according to at least one of the implementations herein. The process 600 includes operations 602 to 612, generally numbered evenly. Systems, apparatuses, and devices of any of FIGS. 1-5 and 7-16 may be referred to for process 600 where relevant.

Process 600 may include "fabricate substrate" 602, and this operation is already described with operation 502 of process 500.

Process 600, however, differs from process 500 by including "apply photoactivated plating seed" 604. In this alternative, the substrate may be immersed or sprayed with the photoactivated plating seed solution. By one example, the photoactivated plating seed solution has nanoparticles or metal salts (like palladium) that can be activated by light.

Process 600 may include "align light projector pattern" 606, and this is performed and detailed with operation 410 of process 400 (FIG. 4).

Once the light projector is aligned, process 600 may include "expose circuit pattern slice by slice" 608, and this is the similar operation as already described with operations 510 and 412 where projection frames of individual circuit pattern slices are projected to a focal plane to form a projected contour line which causes an exposure. The exposure activates the plating seeds only in the areas of the circuit pattern due to the projected contour lines. After each exposure, the focal plane is then moved to a next location on the substrate and over the photoactivated plating seed solution. A developer treatment then may be used if necessary.

Process 600 may include "perform electroless plating" 612, where the substrate is submerged in an electroless plating solution as described above. The activated seeds will catalyze metal deposition substantially exclusively on the previously exposed areas, creating a conductive or metallization material in the shape of the circuit pattern.

Process 600 may include "finish circuit pattern" 614. Thereafter, the substrate may be rinsed to remove residual plating solution. Optionally, an acid dip may be performed to clean and enhance the surface of the resulting circuit. Thereafter, other structures may be attached to the circuit as mentioned for operation 520 (FIG. 5).

It will be appreciated that may different photolithography processes or operations may be used instead of the ones described herein as long as a circuit pattern is projected slice by slice into contour line to provide high resolution or high quality focus to a contour line to add adaptability for curved surfaces as described herein. By one alternative approach, an additive contour photolithography may be used that deposits materials, such as polymers, over a photoresist in layers, and then removes the photoresist, leaving the layered material as desired. Many variations exist.

Referring to FIGS. 14-16, a lathe setup is explained where the substrate may be rotated on a substrate mount. Thus, referring to FIG. 14, a lathe setup 1400 has a substrate 1402 mounted on a substrate mount (not shown) to rotate about an axis of rotation R1 (or longitudinal axis) extending longitudinally through the substrate 1402. This example setup 1400 has a focal plane 1404 that extends parallel to the axis of rotation R1, although this need not always be the case. Thus, although the focal plane 1404 here is shown extending through the substate 1402 parallel to the axis R1, a lathe setup can still work with focal planes that are transverse to the axis of rotation R1. In the example here, a different focal plane position is established with each rotation of the substrate 1402. This is in contrast to the linear substrate motion of the mill setup (system 100 of FIG. 1). The substrate 1402 is shown with a partially formed circuit pattern 1406 where an edge of the focal plane 1404 is shown with a next contour line location 1408 to receive a contour line that exposes the light-sensitive material or photoresist at that location. The contour line is projected within the focal plane 1404 to form the next strip or slice of the circuit pattern 1406. By one example form, the substrate 1402 will only be rotated within a circumferential range needed to expose all desired contour lines of the circuit pattern 1406.

Referring to FIGS. 15-16, a lathe setup or system 1500 shows a substrate mount 1502 that holds a substrate 1504, here being a sphere or a globe for this example, and held so that the substrate 1504 is free to rotate about an axis of rotation R2. In this lathe setup 1500, the substrate 1504 may be rotated completely around 360 degrees to print circuits. The substrate 1504 is symmetrical so that axis of rotation R2 also is an axis of rotational symmetry in this example. By one example form, and depending on the capabilities of the positioning of the light projector, the substrate is not necessarily limited to only those with rotational symmetry. The circuit patterns also do not all need to have rotational symmetry.

Here, the system 1500 has a light projector 1506 aimed toward the substrate 1504, a motor 1516 that controls a gear box 1510 that rotates a shaft 1512 terminating at a shaft bearing 1508 opposite the gear box 1510. The shaft 1512 rotates as shown by arrows 1514 to rotate the substrate 1504 mounted on the shaft 1512. The shaft 1512 establishes the axis of rotation R2 in this example.

Unlike the mill implementation, it may be necessary to move the projector and focal plane to reach different latitudes on the spherical substrate 1504. To accomplish this, the light projector 1506 optionally may be mounted on an arm, rail, or guide 1518 that is curved in this example so that the light projector can translate along the rail 1518 to provide focal planes, and in turn contour lines in multiple different vertical or latitude locations along the axis of rotation R2 (or in other words, generally along the z axis shown). With this arrangement, the light projector 1506 can be pivoted on the rail 1518, and in this example with a fixed radius centered about the center of the spherical substrate 1504 to maintain a constant angle of incidence. Otherwise, the light projector can be translated along a rectilinear path instead. The distance of the light projector from the substrate can be adjustable to change how deeply the focal plane intersects the substrate, whether on a pivot or straight rail. Thus, three degrees of motion may be used in the lathe setup: two dimensions for moving the projector and one for rotating the substrate. Additional rails can be added so that the light projector can move around the substrate in the x-y plane (see xyz axes) as well when desired.

As with the mill setup (FIG. 1), the alignment of the light projector aim and the focal plane with the substrate 1504 can be checked by projecting onto fiducial lines marked on the substrate outside the desired pattern as described above.

In operation, a controller 1522 drives signals to the motor 1516 that rotates the substrate 1504, and provides image files to the light projector 1506 for exposures synchronized to the rotation of the substrate 1504 to each new focal plane position. In addition, the light projector 1506 can be moved along a circular trajectory with the radius centered at the middle of the spherical substrate 1504 to expose successive latitude zones. A focal plane of the light projector 1506 is represented by the black bar cutting across the northern hemisphere and forming a contour line 1520, and the depth of field (or width of the contour line 1520) is exaggerated for visual clarity. Note that a stepper motor may be used here as well, but while being practical in the milling setup, in the lathe setup, it may be more efficient to use a servo-type motor to maintain a continuous, or more continuous, rotation of the substrate 1504 so that the projecting of the frames for exposures is more like a video sequence of frames.

The example contour line 1520 shown on the substrate 1504 as projected from the light projector 1506 is also shown in the slicing process 1600 (FIG. 16). Specifically, and while referring to FIG. 16, an example of circuit pattern slicing is provided for the lathe setup 1500 and with the spherical substrate 1504. Assume the continents 1602 shown on the substrate 1504 represent circuit patterns. A light source point 1604 at light projector 1506 for example projects light or an image to form a focal plane 1606 with a contour line 1608 where the width of the contour line is the same or similar to the depth of field of the focal plane 1606. The depth of field is exaggerated for visual clarity.

The lathe motion arrangement for the contour photolithography is explained as follows. Unlike in milling motion, successive focal plane slices are not parallel in this example. Here for a lathe motion on a spherical substrate, geometric analysis factors depth of field, focal plane position, frame size, and the shape of the substrate to create a circuit pattern to wrap around the curvature of the substrate at the contour lines and ensure that the edges of each exposure (or contour line) align with each other to avoid significant double exposures (or in other words, to avoid too much overlapping of contour lines). By one specific example, this geometry was solved for a sphere of radius 1.5 inches, with the back of the focal plane 1.385 inches from the center of the sphere, a depth of field of 0.0787 inches, and latitudinal shifts of 22.5 degrees. The angular increment of longitude (along the surface of the globe or substrate 1504) for each latitudinal shift was an integral division of 360 degrees to better ensure the contour lines wrap around the curved surface a desired length of the contour line, while the angular increment was sufficiently small so that successive contour lines stay fully in focus.

By yet another alternative approach, a walking contour photolithography technique is used where the light projector may be moved and may aim the light at non-adjacent locations on the substrate rather than a row of consecutive contour line and focal plane locations. These locations may be unplanned. If the position and attitude of the focal plane with respect to the substrate can be measured precisely with accelerometers or other sensors, and a graphics engine is synchronized to quickly render frames based upon a current light projector position, then pattern slices can be exposed if and when the focal plane cuts through the substrate and pattern. If the controller and graphics engine detect an angle of incidence which is too high, or an area that has already been exposed, then light to those areas can be suppressed. Any pattern areas that were missed on one pass could be covered on a different one until the whole pattern is exposed. This implementation also can make use of machine vision, alternately using the light projector as a camera in between frames to detect the relative location of the substrate. In practice, the exposures still may be usually performed on a mill or lathe setup to achieve the highest resolution, although light projectors mounted on robotic arms and gimbles can be practical depending on the complexity of the shape of the substrate and setup arrangement. In some cases, dynamic frame rendering and machine vision features can make substrate alignment easier, allow for on-the-fly corrections due to substrate tolerance, and limit bad exposures due to high angle of incidence to make the process more efficient.

As other alternatives, the contour photolithography is not specifically limited to manufacturing of PCBs. Silicon microchips on doubly-curved substates can also be made with maskless DLP contour photolithography described herein. Curved charge-coupled device (CCD) can be produced with the present systems and methods to form image sensors for cameras shaped similar to a human retina that can increase a field-of-view of such cameras. The image plane in the back of a camera is not actually flat but curves forward slightly toward the lens at the edges of the senor field. Flat image sensors are not able to use this extra area of the field because this area goes out of focus. A curved image sensor formed by the present methods and systems can be arranged to use the full field of the image sensor. Also, the present methods and systems enable doubly-curved LCD or LED screen surfaces. In another alternative, the systems and methods herein may be used to generate microlenses combined with LEDs on a doubly-curved and/or flexible substrate that can function as invisible (or camouflage) armor or clothing for a vehicle or person.

The contour photolithography methods described herein also have applications in biotechnology or any other field where additive manufacturing techniques are needed. Thus, the present method and system may be used to etch patterns onto curved silicone or hydrogel substrates to aid in the creation of artificial tissue and organs. The curved CCD image sensor modeled after the human eye mentioned previously can lead to artificial retinas.

It should be appreciated that the processes 400, 500, and 600 may include any number of additional or alternative operations, and the operations need not be performed in the illustrated order. Also, the operations of process 400, 500, or 600 may be performed concurrently, and/or may be incorporated into a more comprehensive procedure or process having additional functionality not described in detail herein. Moreover, one or more of the tasks shown and described in the context of any of the processes herein can be omitted from a practical implementation of the process as long as the intended overall functionality remains intact.

For the sake of brevity, conventional techniques related to user interfaces, speech recognition, avionics systems, including determination of parameters associated with a transcribed message and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an implementation of the subject matter.

The subject matter may be described herein in terms of functional and/or logical block, module, or unit components, and with reference to symbolic representations of operations, processing tasks, and functions that may be performed by various computing components or devices. It should be appreciated that the various block components shown in the figures may be realized by any number of hardware components configured to perform the specified functions. For example, an implementation of a system or a component may employ various integrated circuit components, e.g., memory elements, digital signal processing elements, logic elements, look-up tables, or the like, which may perform a variety of functions under the control of one or more microprocessors or other control devices. Furthermore, implementations of the subject matter described herein can be stored on, encoded on, or otherwise embodied by any suitable non-transitory computer-readable medium as computer-executable instructions or data stored thereon that, when executed (e.g., by a processing system), facilitate the processes described above.

The foregoing description refers to elements or nodes or features being "coupled" together. As used herein, unless expressly stated otherwise, "coupled" refers to one element/node/feature is directly or indirectly joined to (or directly or indirectly communicates with) another element/node/feature, and not necessarily mechanically. Thus, although the drawings may depict one example arrangement of elements directly connected to one another, additional intervening elements, devices, features, or components may be present in an implementation of the depicted subject matter. In addition, certain terminology may also be used herein for the purpose of reference only, and thus are not intended to be limiting.

The foregoing detailed description is merely an example and is not intended to limit the subject matter of the application and uses thereof. Furthermore, there is no intention to be bound by any theory presented in the preceding background, brief summary, or the detailed description.

While at least one example implementation has been presented in the foregoing detailed description, it should be appreciated that a vast number of variations exist. It should also be appreciated that the example implementation or example implementations are only examples, and are not intended to limit the scope, applicability, or configuration of the subject matter in any way. Rather, the foregoing detailed description will provide those skilled in the art with a convenient road map for implementing an example implementation of the subject matter. It should be understood that various changes may be made in the function and arrangement of elements described in an example implementation without departing from the scope of the subject matter as set forth in the appended claims. Accordingly, details of the example implementations or other limitations described above should not be read into the claims absent a clear intention to the contrary.

What is claimed is:

1. A method, comprising:

receiving data of an image of a circuit pattern formed of multiple circuit pattern slices;

providing the data to a light projector aimed toward at least one light-sensitive material having a curved surface over a substrate of an object and to project a focal plane with a depth of focus;

generating a patterned light-sensitive material, comprising:

projecting at least one sequence of frames from the light projector one frame after another over time so the at least one light-sensitive material passes through the depth of focus, wherein each frame within a single sequence has an image of a different one of the circuit pattern slices and projected so that each circuit pattern slice forms a contour line of projected light on the at least one light-sensitive material, wherein the contour lines each correspond to a region of the image of the circuit to cooperatively form part of the same image of the circuit on the curved surface, wherein each contour line being arranged to cover a different location of the at least one light-sensitive material, and wherein each contour line is defined on the curved surface as the region of the curved surface that lies within the depth of focus and within which the projected image is in focus, and moving the light projector, the substrate, or both after an individual frame projection so that each contour line in the same sequence is formed at a different one of the locations on the at least one light-sensitive material, wherein the light projector forms a focal plane at an entire contour line covering the light sensitive material at each frame, and wherein the light projector is positioned relative to the substrate at each frame so that the focal plane is maintained non-perpendicular to an entire surface of the light-sensitive material with the entire contour line; and generating a conductive circuit with a curved surface on the substrate comprising using the patterned light-sensitive material to pattern at least one conductive material over the substrate.

2. The method of claim 1, wherein the contour lines depend on the depth of focus so that the entire width of the contour line remains in focus.

3. The method of claim 2, wherein the width of the circuit pattern slices are equal to or less than the depth of focus and may be different widths on individual circuit pattern slices.

4. The method of claim 2, wherein the aiming of the light projector comprises aiming at least two light projectors or a single light projector with replaceable lenses with at least one light projector or lens to construct course circuit pattern structure and at least one second light projector or lens to construct fine circuit pattern structure.

5. The method of claim 1, wherein the projected contour lines are formed on a doubly-curved surface of the light-sensitive material.

6. The method of claim 1, comprising synchronizing the moving of the substrate, the light projector, or both with the projection of the frames so that the focal plane is moved on the substrate after projection of an individual frame for multiple frames.

7. The method of claim 1, wherein a shape of the surface of the light-sensitive material to form the contour line having an arrangement of only one or more curved parts, curved and flat parts together, one or more singly-curved parts, one or more doubly-curved parts, one or more convex parts, or one or more concave part.

8. A system, comprising:

a light projector to project frames each having data of a different circuit pattern slice of a circuit pattern image and to project a focal plane with a depth of focus, and projecting a contour line formed from one of the circuit pattern slices;

a substrate mount to hold a substrate of an object at a position to intersect the focal plane;

memory; and processor circuitry forming at least one processor communicatively coupled to the memory and the light projector, wherein the processor is arranged to operate by:

generating a patterned light-sensitive material comprising:

projecting at least one sequence of the frames from the light projector one frame after another over time and toward a curved surface of at least one light-sensitive material over the substrate so the at least one light-sensitive material passes through the depth of focus, and wherein each frame forms one of the contour lines of projected light on the at least one light-sensitive material, wherein the contour lines each correspond to a region of the image of the circuit to cooperatively form part of the same image of the circuit on the curved surface, wherein each contour line being arranged to cover a different location of the at least one light-sensitive material, and wherein each contour line is defined on the curved surface as the region of the curved surface that lies within the depth of focus and within which the projected image is in focus, and moving at least one of the light projector, the substrate, or both after an individual frame projection so that each contour line in the same sequence is formed at a different location on the light-sensitive material so that the contour lines each correspond to a section of the image of the circuit to cooperatively form part of the same image of the circuit on the curved surface, wherein the light projector forms the focal plane at an entire contour line covering the light sensitive material at each frame, and wherein the light projector is maintained at a tilted orientation relative to the substrate and that changes at each frame so that the focal plane is maintained non-perpendicular to an entire surface of the light-sensitive material with the entire contour line; and generating a conductive circuit with a curved surface over the substrate comprising using the patterned light-sensitive material to pattern at least one conductive material over the substrate.

9. The system of claim 8, wherein the width of a single contour line is less than or equal to a depth of focus of the focal plane.

10. The system of claim 8, wherein the light projector has an array of pixels with a resolution and pixel size, and wherein the maximum width of the contour lines depends on the resolution and size of the pixels.

11. The system of claim 8, wherein the focal planes of consecutive frames projecting consecutive contour lines are non-parallel.

12. The system of claim 8, wherein the substrate mount is arranged to rotate the substrate about an axis of rotation, wherein the axis of rotation extends parallel to or in the focal plane.

13. The system of claim 8, wherein the substrate mount is arranged to rotate the substrate about an axis of rotation, and wherein the focal plane extends transverse to the axis of rotation.

14. The system of claim 8, wherein the focal plane of each frame of a same circuit pattern image is disposed by setting an angle of incidence between a normal line of the surface of the light-sensitive material to receive the contour line and light rays from the projector so that all contour lines of the same circuit pattern stay within an image frame size used by the light projector.

15. At least one non-transitory computer-readable medium having computer-executable instructions stored thereon that, when executed by a computing device, cause the computing device to operate by:

receiving data of a circuit pattern image having multiple circuit pattern slice images and arranged to be used to project the circuit pattern slice images at a light projector aimed toward a curved surface of at least one light-sensitive material over a substrate of an object and to project a focal plane with a depth of focus defined by a depth of the focal plane;

generating a patterned light-sensitive material comprising:

projecting at least one sequence of frame projections one frame after another over time so the at least one light-sensitive material passes through the depth of focus, wherein each frame within a single sequence has a different one of the circuit pattern slice images and projected so that each circuit pattern slice image forms a contour line of projected light on the at least one light-sensitive material, wherein the contour lines each correspond to a region of the image of the circuit to cooperatively form part of the same image of the circuit on the curved surface, wherein each contour line being arranged to cover a different location of the at least one light-sensitive material, and wherein each contour line is defined on the curved surface as the region of the curved surface that lies within the depth of focus and within which the projected image is in focus, and moving the substrate, the light projector, or both after an individual frame projection so that each contour line in the same sequence is formed at a different one of the locations on the at least one light-sensitive material, wherein the light projector forms a focal plane at an entire contour line covering the light sensitive material at each frame, and wherein the light projector is positioned relative to the substrate at each frame so that the focal plane is maintained non-perpendicular to an entire surface of the light-sensitive material with the entire contour line; and generating a conductive circuit with a curved surface on the substrate comprising using the patterned light-sensitive material to pattern at least one conductive material over the substrate.

16. The medium of claim 15, wherein the light projector is arranged to maintain the focal plane at a fixed angle relative to horizontal as a position of the focal plane on the substate is shifted from one contour line position to another contour line position.

17. The medium of claim 15, comprising rotating the substate about an axis of rotation between a time of projection of each frame, wherein the light projector projects the focal plane so that the focal plane intersects a different surface portion of the light-sensitive material at each frame to form the contour lines in a parallel array where an entire width of each single contour line is in focus within the focal plane.

18. The medium of claim 15, wherein the circuit pattern image comprises a first end opposite a second end, and wherein the contour lines are arrayed in a linear order from the first end to the second end.

* * * * *